(12) United States Patent
Hino

(10) Patent No.: US 7,053,726 B2
(45) Date of Patent: May 30, 2006

(54) VOLTAGE CONTROL OSCILLATOR HAVING MODULATION FUNCTION

(75) Inventor: Takuo Hino, Osaka (JP)

(73) Assignee: Matsushita Electric Industrial CO, Ltd., Osaka (JP)

( * ) Notice: Subject to any disclaimer, the term of this patent is extended or adjusted under 35 U.S.C. 154(b) by 0 days.

(21) Appl. No.: 10/522,395

(22) PCT Filed: Aug. 11, 2003

(86) PCT No.: PCT/JP03/10235

§ 371 (c)(1),
(2), (4) Date: Jan. 25, 2005

(87) PCT Pub. No.: WO2004/015856

PCT Pub. Date: Feb. 19, 2004

(65) Prior Publication Data

US 2005/0270114 A1    Dec. 8, 2005

(30) Foreign Application Priority Data

Aug. 9, 2002    (JP)    ............................. 2002-232409

(51) Int. Cl.
*H03B 1/00*    (2006.01)
(52) U.S. Cl. .............................. 331/177 V; 331/117 R; 331/117 FE; 331/179; 332/125; 332/126; 332/127
(58) Field of Classification Search ............ 331/177 V, 331/117 R, 117 FE, 179; 332/125, 126, 332/127
See application file for complete search history.

(56) References Cited

U.S. PATENT DOCUMENTS

| 6,621,364 B1 * | 9/2003 | Grewing et al. ........ 331/177 V |
| 6,842,081 B1 * | 1/2005 | Wang et al. ............. 331/117 R |
| 6,906,596 B1 * | 6/2005 | Kitamura et al. .......... 331/36 C |
| 2003/0052744 A1 | 3/2003 | Suto ............................ 332/177 |

FOREIGN PATENT DOCUMENTS

| JP | 63-174427 A | 7/1988 |
| JP | 2001-352218 A | 12/2001 |
| JP | 2003-017935 A | 1/2003 |

* cited by examiner

*Primary Examiner*—Arnold Kinkead
(74) *Attorney, Agent, or Firm*—Hamre, Schumann, Mueller & Larson, P.C.

(57) ABSTRACT

There is provided a VCO having a modulation function capable of easily constituting a correction circuit which can obtain a predetermined modulation degree even when element irregularities are present. A modulation current terminal is connected to an anode side connection point of a first and a second varactor diode. A first resistor is connected between the connection point and an anode side connection point (grounding voltage) of a third and a fourth varactor diode. Voltage deciding the oscillation frequency is input from the voltage input terminal via the second resistor to the cathode side connection point of the first and the third varactor diode and via the third resistor to the cathode side connection point of the second and the fourth varactor diode. A first and a second capacitor are connected from a power source via a first and a second inductor to the cathode side of the first and the second varactor diode. Thus, it is possible to obtain a circuit having a frequency modulation degree expressed as a function of Kv.

19 Claims, 26 Drawing Sheets

VOLTAGE CONTROL OSCILLATOR HAVING MODULATION FUNCTION

TECHNICAL FIELD

The present invention relates to a voltage controlled oscillator having a frequency modulation function for use in communication equipment and the like.

BACKGROUND ART

FIG. 25 is a circuit diagram showing an exemplary configuration of a conventional voltage controlled oscillator (hereinafter, abbreviated as a "VCO") having a frequency modulation function used in communication equipment.

In FIG. 25, reference numeral 5 denotes an output circuit, 11, 12, 13, and 14 denote varactor diodes, 16 and 17 denote inductors, and 26 denotes a voltage source.

An anode side of the varactor diode 13 and an anode side of the varactor diode 14 are connected to a voltage input terminal, and an anode side of the varactor diode 11 and an anode side of the varactor diode 12 are connected to a modulation signal terminal. A cathode side of the varactor diode 11 and a cathode side of the varactor diode 13 are connected to one end of the inductor 16, and a cathode side of the varactor diode 12 and a cathode side of the varactor diode 14 are connected to one end of the inductor 17. The other ends of the inductor 16 and the inductor 17 are connected to the voltage source 26. The resonance of the inductors and the varactor diodes realizes the VCO.

Frequency modulation is performed by changing a capacitance value of the varactor diodes 11 and 12 by inputting a voltage to the modulation signal terminal.

In the conventional VCO, when the inductors or the varactor diodes vary in inductance or capacitance, the input voltage versus oscillation frequency characteristics (hereinafter, abbreviated as "Kv") of the VCO are changed. When a modulation voltage is input from the modulation signal terminal at a constant amplitude in this state, a modulation factor of an output signal is changed in accordance with the variations of Kv. In order to obtain a constant modulation factor, it is necessary to configure the VCO such that the inductors are provided as external components so as to allow the inductance to be adjusted, or that discrete components having little variation are used as the varactor diodes. Further, the voltage versus capacitance characteristics of the varactor diodes are not constant, and their nonlinearity also causes a modulation factor to be changed. Consequently, it is difficult to use the VCO over a wide oscillation frequency range.

In recent years, the downsizing of communication equipment has been required, and accordingly there is a need to incorporate a VCO into an IC. In the case of incorporating inductors and varactor diodes in the IC, element variations are larger than in the case where discrete components are used. Accordingly, the VCO is required to have means for compensating a required oscillation frequency range or variations of a modulation factor at the time of frequency modulation.

In conventional VCO circuits, there is no relationship between a voltage for determining an oscillation frequency of the VCOs in a voltage input terminal and a control signal amplitude for determining a modulation factor in a modulation signal terminal, which makes it difficult to compensate variations of a modulation factor. In conventional VCOs with a frequency modulation function, there is no relationship between a voltage input terminal for determining an oscillation frequency of the VCOs and a modulation signal terminal for performing frequency modulation, and they are controlled individually as respective circuits.

DISCLOSURE OF INVENTION

A VCO of the present invention uses a circuit configuration that allows a modulation factor of the VCO with respect to a modulation control current terminal to be expressed as a function of an oscillation frequency of the VCO with respect to a voltage control terminal for an oscillation frequency (Kv). Therefore, it is possible to compensate fluctuations of the modulation factor due to relative variations of elements.

Compensation is performed in the following manner. When a frequency is fluctuated, Kv also is fluctuated at a given rate. On this account, compensation is performed at a reverse rate relative thereto so as to make a modulation factor constant. As a result, the modulation factor is made constant at any oscillation frequency.

Further, in a VCO having a plurality of oscillation frequency bands, which is realized by making a fixed capacitance with respect to a resonant circuit variable so that an oscillation frequency is shifted, Kv is changed at a given rate when a band is switched. Also in the case where a band is switched, compensation is performed at a reverse rate relative thereto, which allows a modulation factor to be made constant even when the band is changed.

In the case where a wide oscillation frequency range is required, compensation with respect to a frequency and compensation between bands are performed in combination, so that a modulation factor can be compensated to be constant.

As a system of a compensation circuit, it is also possible that a compensation rate with respect to modulation data is calculated using frequency data and band data, and the data thus obtained is input to a digital-analog converter, where the data is controlled to be analog data.

In the case of using the digital-analog converter, a filter for eliminating a clock noise of the digital-analog converter may be provided.

Further, in the case of a complicated transmitting system in which a modulation factor signal as a transmission signal has its band limited, a modulation logic becomes very complicated. In such a case, band-limited modulation data is stored in a ROM in advance, and modulation data is compensated based on frequency data and band data and the ROM is controlled, whereby a modulation factor can be compensated to be kept constant.

In a compensation circuit configured actually, compensation with respect to a frequency and compensation between bands can be performed, but a center of a modulation factor is fluctuated due to absolute variations of the circuit. This can be solved by adjusting an output level of the digital-analog converter to be the center of the modulation factor.

As described above, the VCO according to the present invention has a configuration in which a modulation factor can be expressed as a function of Kv. Therefore, even when the VCO with a wide range of element variations is incorporated into an IC, the modulation factor can be compensated easily.

BEST MODE FOR CARRYING OUT THE INVENTION

Figure 1:
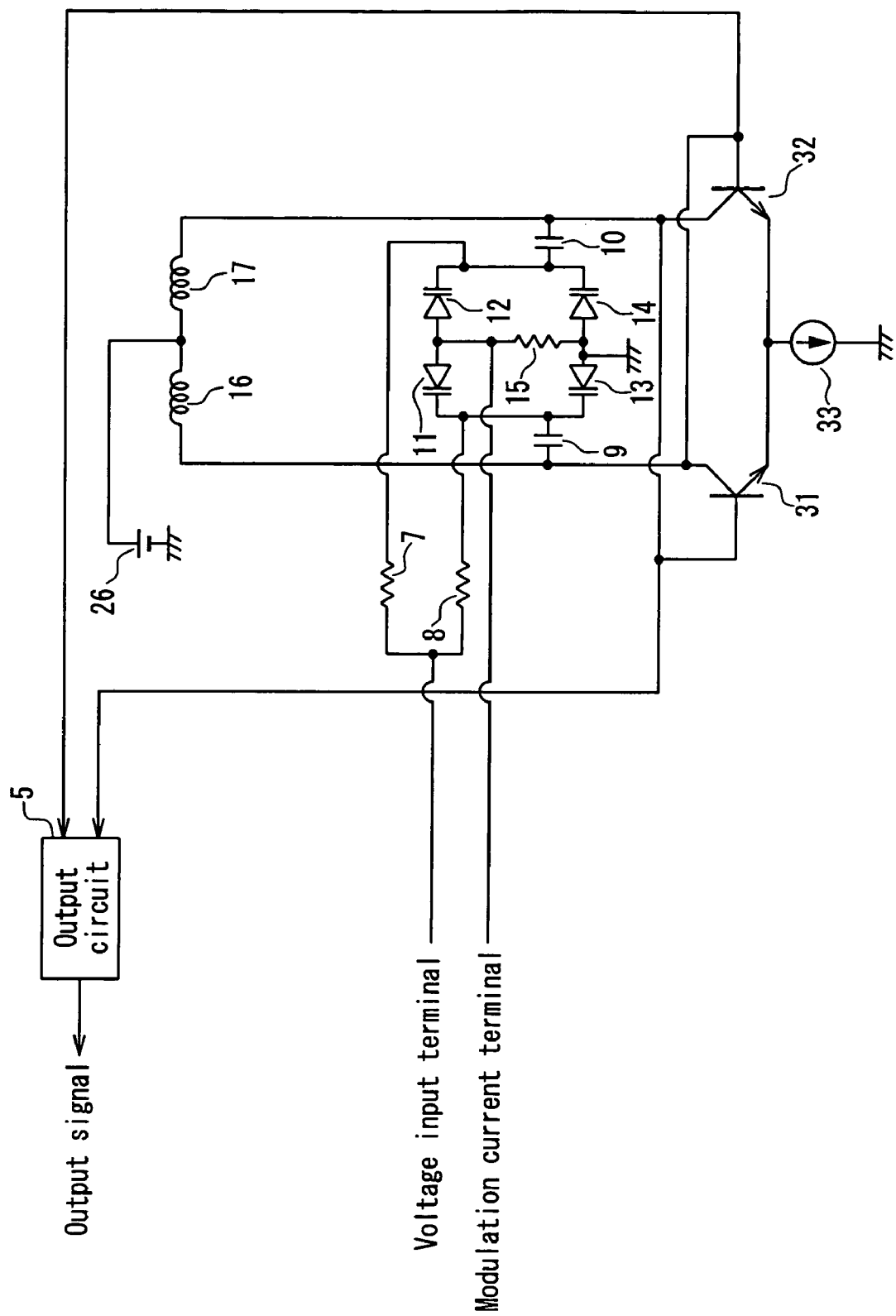
FIG. 1 is a circuit diagram showing an exemplary configuration of a voltage controlled oscillator with a modulation function according to a first embodiment of the present invention.

Hereinafter, a VCO with a modulation function according to each preferred embodiment of the present invention will be described in detail with reference to the drawings. In all the drawings, the components having the same configuration and function are denoted with the same reference numerals, and a repeated description thereof is omitted.

FIG. 1 is a circuit diagram showing an exemplary configuration of a VCO with a modulation function according to a first embodiment of the present invention. In FIG. 1, reference numeral 5 denotes an output circuit, 7, 8, and 15 denote resistors, 9 and 10 denote capacitors, 11, 12, 13, and 14 denote varactor diodes, 16 and 17 denote inductors, 26 denotes a voltage source, 31 and 32 denote transistors, and 33 denotes a current source.

The varactor diode includes any element that has its capacitance changed by a voltage between terminals at both ends thereof.

The inductors 16 and 17, the varactor diodes 11, 12, 13, and 14, and the capacitors 9 and 10 configure a resonant part, which is connected to oscillation transistors 31 and 32 to carry out an oscillation operation.

When no modulation is performed, no current or a fixed DC current flows through a modulation current terminal. A voltage of a voltage input terminal is determined so that the VCO has an oscillation frequency required in this state. Actually, the oscillation frequency of the VCO generally is controlled by a PLL, and a frequency control voltage of the PLL is applied to the voltage input terminal.

Frequency modulation can be performed by changing the non-modulation state into a state in which a modulation current is fed to the modulation current terminal, and changing the capacitance of the varactor diodes 11 and 12 accordingly.

When the oscillation frequency/voltage of the voltage input terminal of the VCO is represented by Kv (the unit: Hz/V), Kv is changed in accordance with relative variations of the elements such as inductors, capacitors, and varactor diodes. Further, due to the nonlinearity of the varactor diodes, Kv is changed even when the oscillation frequency of the VCO is changed. However, a modulation factor of the VCO of the present embodiment can be expressed as a function of Kv.

For example, when the varactor diodes 13 and 14 are configured by five elements arranged in parallel, and the varactor diodes 11 and 12 are configured by one element, the elements used herein being the same so that variations of the varactor diodes 11, 12, 13, and 14 are suppressed, the relationship between Kv and the modulation factor is represented by the following expression:

Modulation factor=$Kv \times (1/6) \times$(modulation current)$\times$(resistance value of resistor 15).

In other words, in order to keep the modulation factor constant, a modulation current as an inverse function of a change of Kv is provided, so that a constant modulation factor can be obtained without an influence of relative variations of the respective elements.

Figure 20:
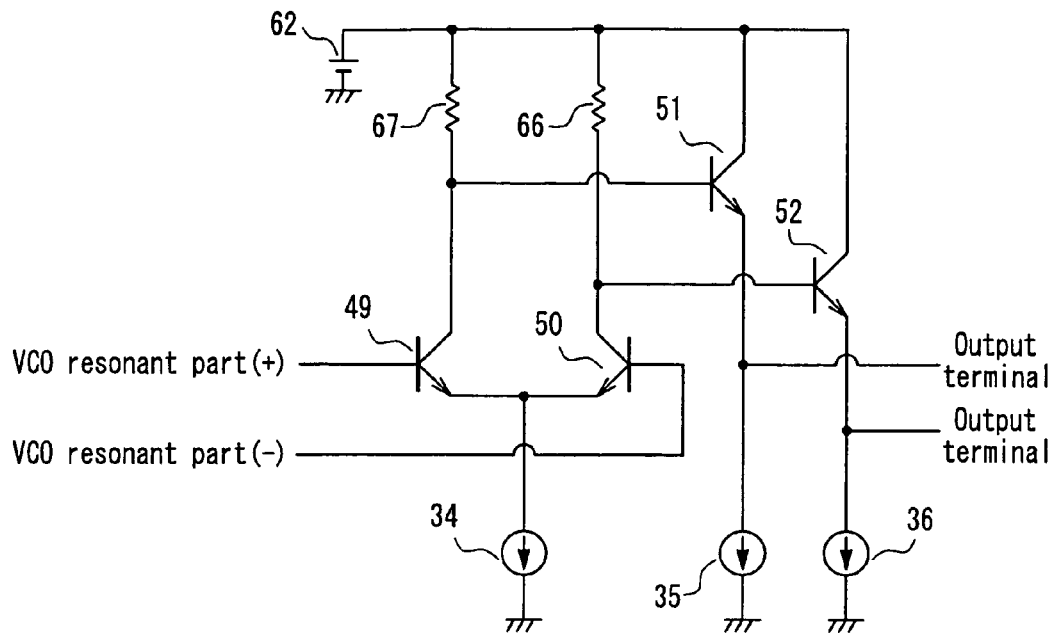
FIG. 20 is a circuit diagram showing an exemplary configuration of an output circuit shown in FIGS. 1 to 19.

The output circuit 5 takes a signal from the resonant part. An example of the output circuit 5 is shown in FIG. 20.

Figure 2:
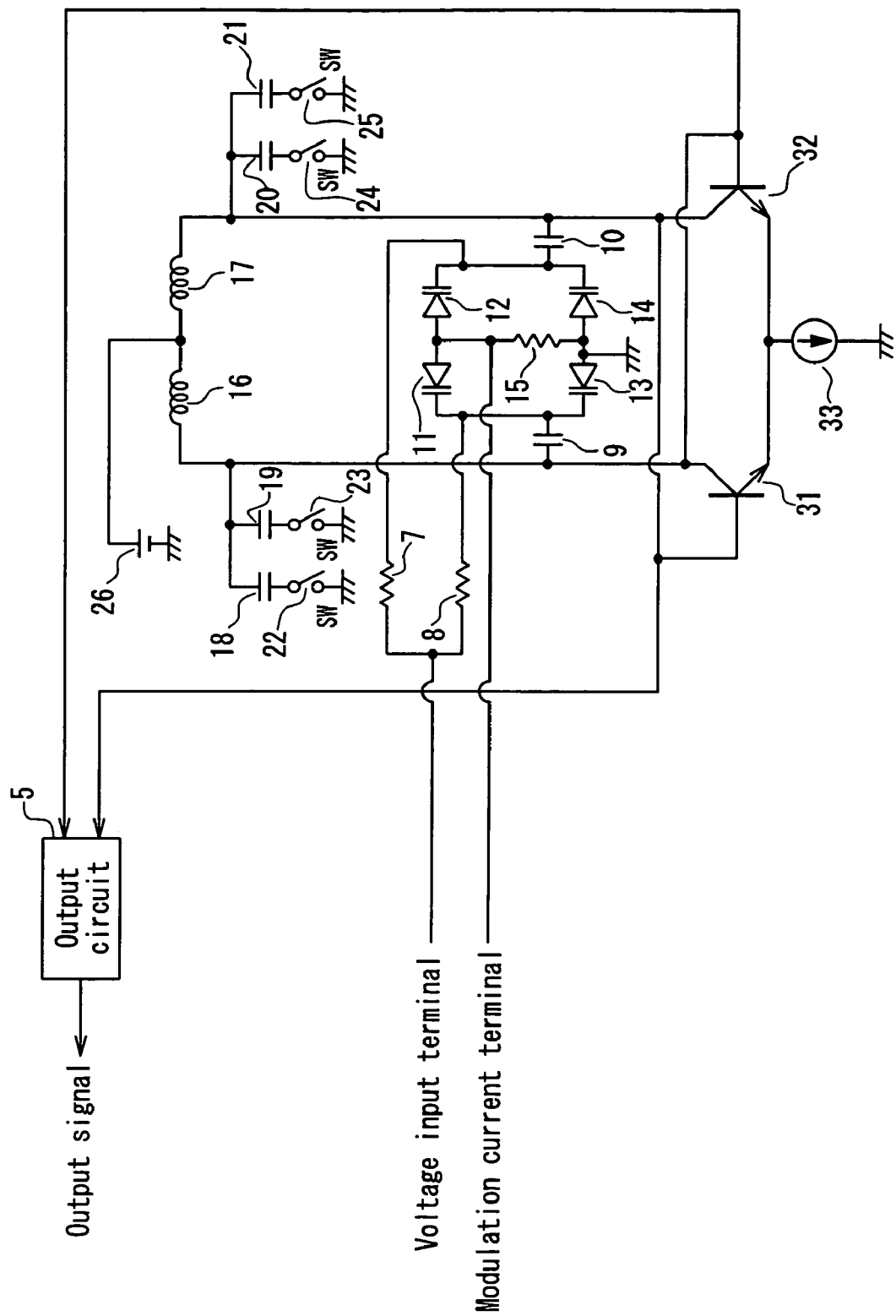
FIG. 2 is a circuit diagram showing an exemplary configuration of a voltage controlled oscillator with a modulation function according to a second embodiment of the present invention.

FIG. 2 is a circuit diagram showing an exemplary configuration of a VCO with a modulation function according to a second embodiment of the present invention. The VCO of this embodiment is different from the VCO shown in FIG. 1 in that a frequency band switching function is added.

In FIG. 2, reference numerals 18 to 21 denote capacitors, and 22 to 25 denote switches. These elements have a function of connecting or disconnecting a fixed capacitance to or from the resonant part or changing a capacitance, and allow an oscillation frequency of the VCO to be shifted, independently from a voltage of the voltage input terminal. Consequently, it is possible to configure the VCO that has a plurality of frequency bands with respect to a change of a voltage of the voltage input terminal. As a result, by switching a frequency band, a wide oscillation frequency range of the VCO can be realized. Even when the frequency band is switched, a modulation factor satisfies the relation expression described in the first embodiment.

Figure 26:
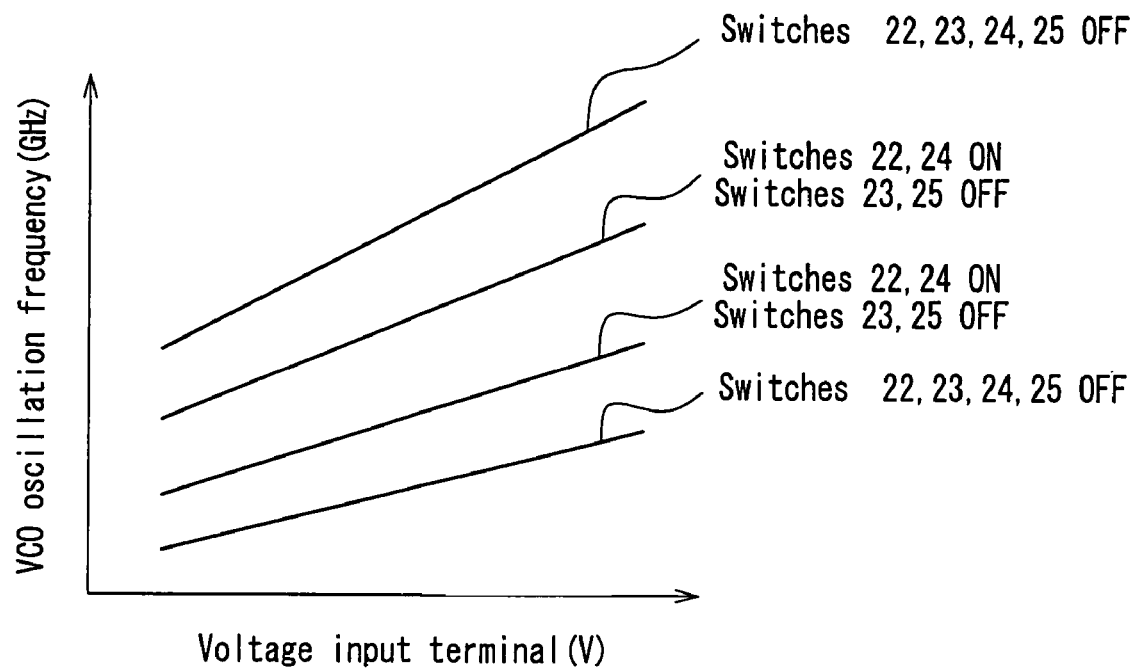
FIG. 26 is a graph showing an example of the frequency band characteristics of the VCO in the case where a frequency band switching function is used.

FIG. 26 shows the VCO characteristics in the case where the frequency band switching function is used. In FIG. 26, capacitances C18 and C19 (C20 and C21) of the capacitors 18 and 19 (capacitors 20 and 21), respectively, are set so as to satisfy the following expression: C18 (=C20)<C19 (=C21). The characteristics shown in FIG. 26 are obtained in the state where frequency modulation is not performed, that is, no current or a constant current is input to and output from the modulation current terminal. From this state, a current in accordance with a frequency modulation factor is input to and output from the modulation current terminal, so that frequency modulation can be performed mainly with respect to the VCO oscillation frequencies in FIG. 26.

Figure 3:
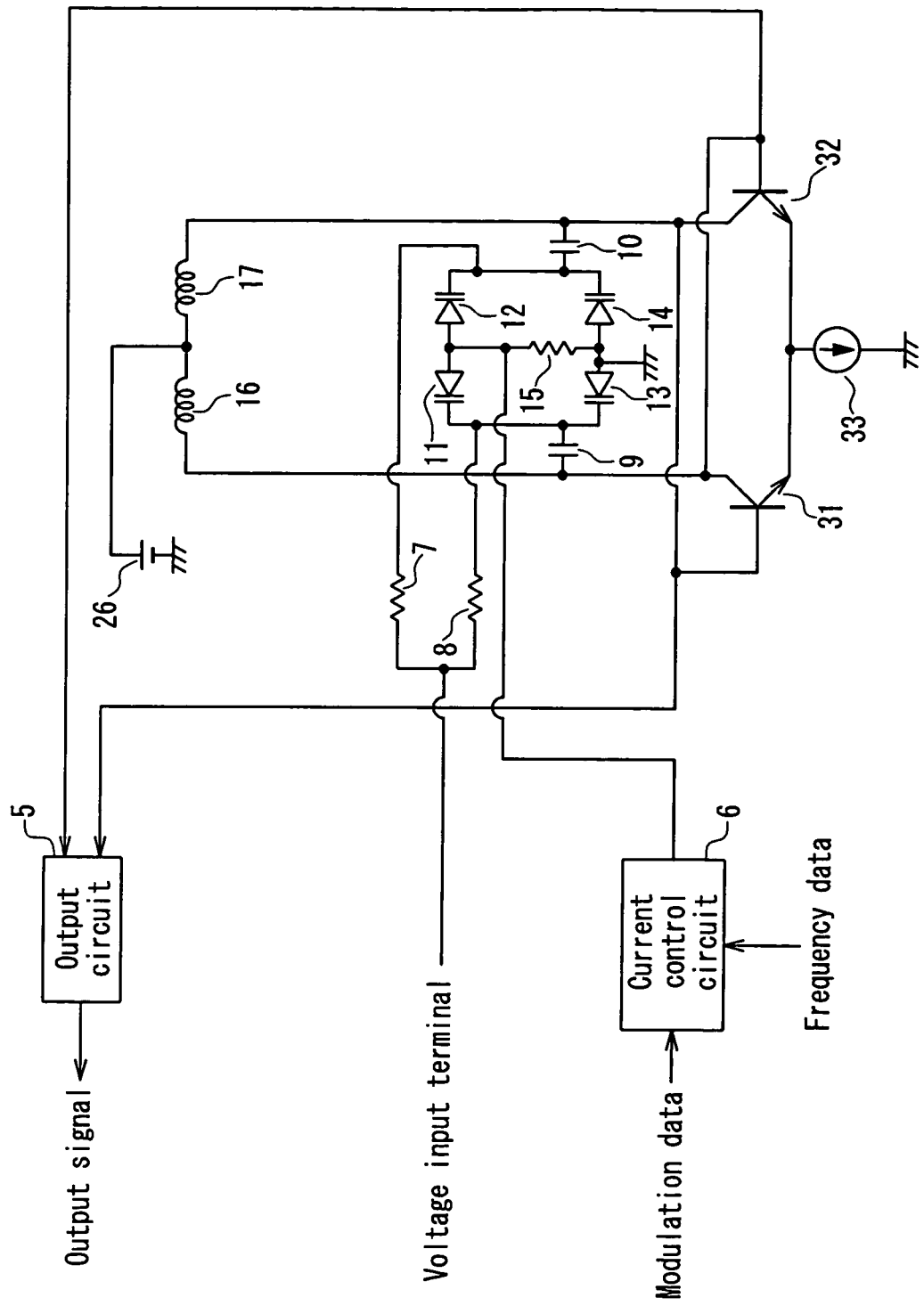
FIG. 3 is a circuit diagram showing an exemplary configuration of a voltage controlled oscillator with a modulation function according to a third embodiment of the present invention.

FIG. 3 is a circuit diagram showing an exemplary configuration of a VCO with a modulation function according to a third embodiment of the present invention. The VCO of this embodiment is different from the VCO shown in FIG. 1 in that a current control circuit 6 for compensating a modulation factor is added. In FIG. 3, the current control circuit 6 is controlled so that a predetermined modulation factor is obtained from frequency data and modulation data.

Figure 27:
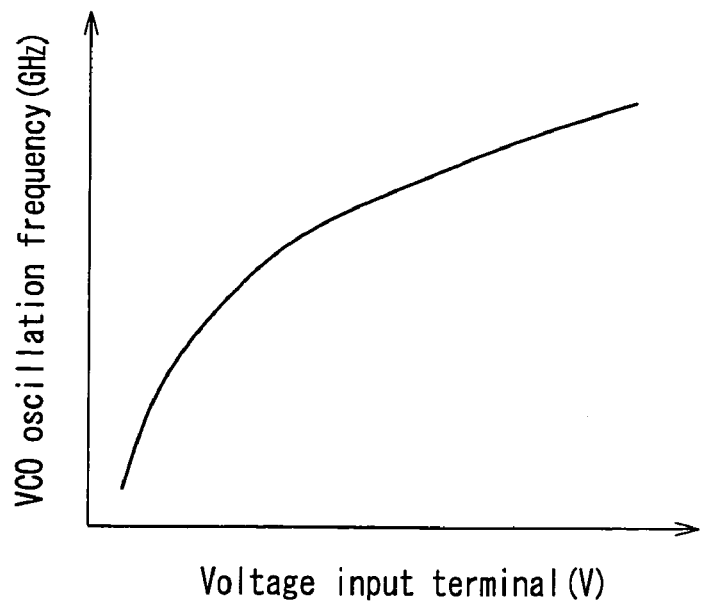
FIG. 27 is a graph showing the oscillation frequency characteristics of the VCO.
Figure 28:
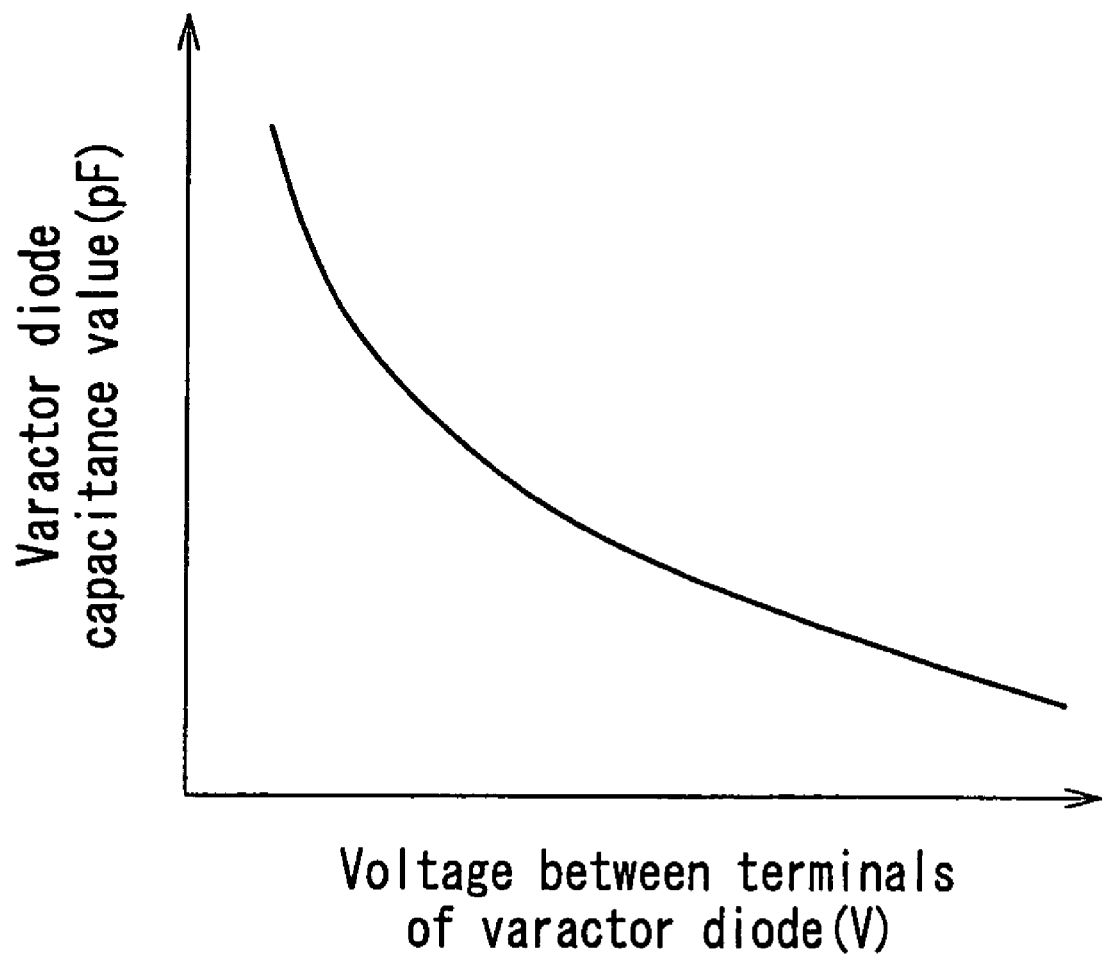
FIG. 28 is a graph showing the capacitance change characteristics of a varactor diode.

Herein, the frequency data indicates a value of a voltage applied between terminals of the varactor diode in a given frequency band. The VCO has the oscillation frequency characteristics precisely as shown in FIG. 27 due to a capacitance change of the varactor diode. This is because the capacitance change of the varactor diode has characteristics as shown in FIG. 28 with respect to the voltage applied between the terminals of the varactor diode. A value obtained by differentiating the oscillation frequency characteristics of the VCO corresponds to Kv. Thus, unless the inclination of the VCO frequency characteristics is constant, a constant modulation current input from the modulation signal terminal alone allows the modulation factor to be deviated in an amount corresponding to a deviation of the inclination. On this account, by adjusting a modulation current so that the characteristics of the capacitance change of the varactor diode are compensated, a modulation factor that is constant at any VCO oscillation frequency can be obtained. A compensation value may be obtained either by performing an inverse operation from a set frequency in accordance with the characteristics of the VCO or by using a voltage of the voltage input terminal in the state of a lock operation in the PLL.

The modulation data indicates a modulation signal before being compensated and in the case of FSK (Frequency Shift Keying), a signal having a constant modulation amplitude in accordance with a modulation factor. The current control circuit 6 modulates the modulation data with a conversion circuit such as a gm (mutual conductance) conversion circuit in accordance with the frequency data, thereby obtaining a predetermined modulation current.

Figure 22:
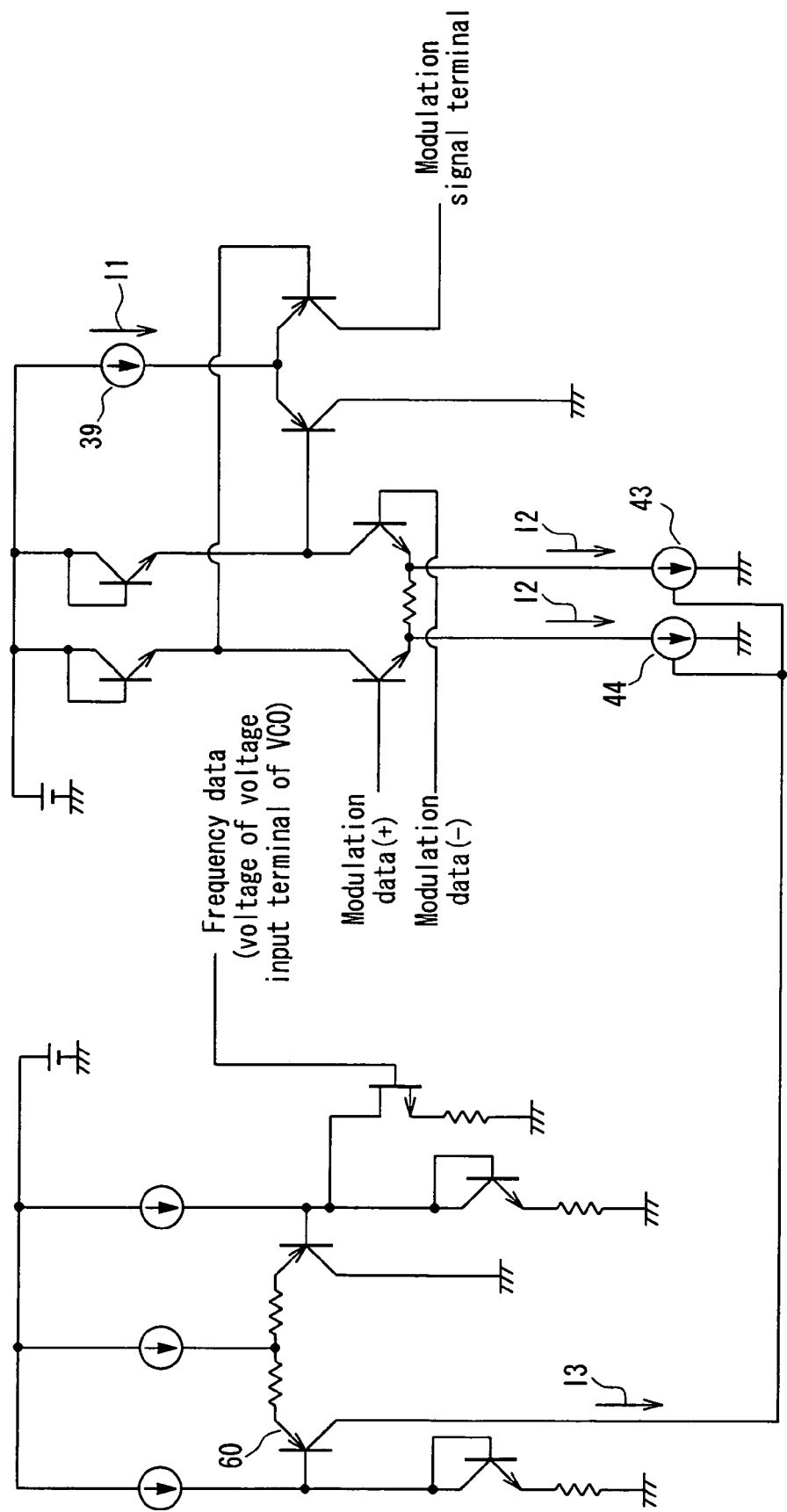
FIG. 22 is a circuit diagram showing an exemplary configuration of a current control circuit in the case where compensation is performed based on frequency data.

FIG. 22 is a circuit diagram showing an exemplary configuration of the current control circuit 6 in the case where compensation is performed based on the frequency data. In FIG. 22, this is a gm conversion circuit, which allows a conversion of an amplitude in accordance with the modulation data into a current to be fed to the modulation current terminal. When a current source 39 has a current value I1, and current sources 43 and 44 have a current value I2, a gm value is determined by the ratio between I1 and I2. This circuit is configured such that when a current flowing from a corrector of a transistor 60 has a value I3, the values I2 and I3 satisfy the following expression: I2=A×I3 (wherein A is a constant) or I2=A×I3+B (wherein A and B are constants). I3 is a value of a current that is changed in accordance with the frequency data (voltage applied to the varactor diode), and a modulation factor is changed when Kv is changed due to the diode characteristics shown in FIG. 28. This circuit allows the modulation factor to be compensated by changing the value I3 in accordance with a capacitance change ratio of the diode characteristics.

Figure 4:
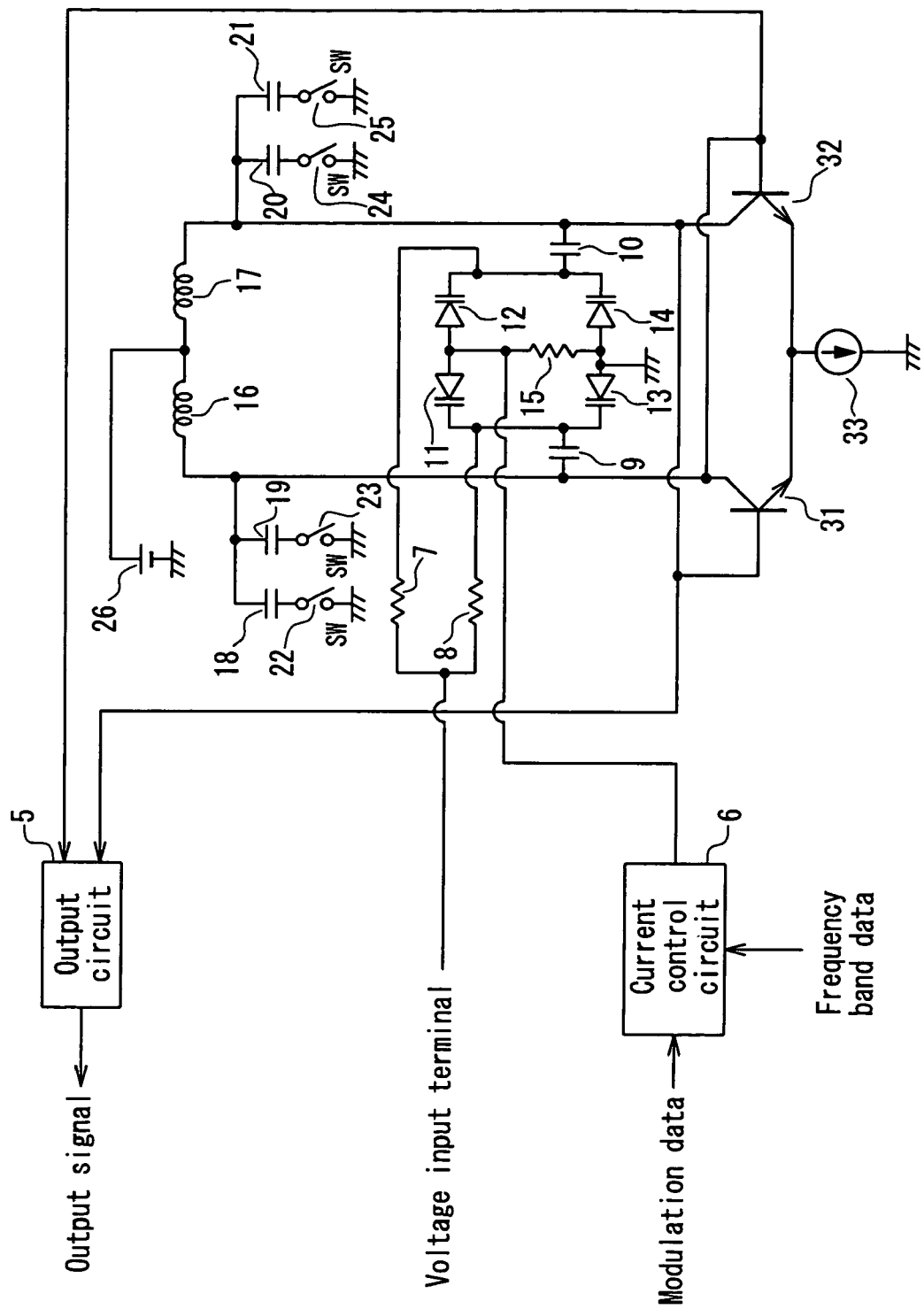
FIG. 4 is a circuit diagram showing an exemplary configuration of a voltage controlled oscillator with a modulation function according to a fourth embodiment of the present invention.

FIG. 4 is a circuit diagram showing an exemplary configuration of a VCO with a modulation function according to a fourth embodiment of the present invention. The VCO of this embodiment is different from the VCO shown in FIG. 2 in that the current control circuit 6 for compensating a modulation factor is added. In FIG. 4, the current control circuit 6 controls a modulation current from frequency band data and the modulation data so that a predetermined modulation factor is obtained.

This control is required in the following reason. That is, when a frequency band is changed, the inclination of the oscillation frequency of the VCO is changed as shown in FIG. 26, and thus a modulation factor has to be compensated in accordance with the band. By performing such compensation, a deviation of the modulation factor due to a change of Kv caused by changing the frequency band can be eliminated.

Figure 23:
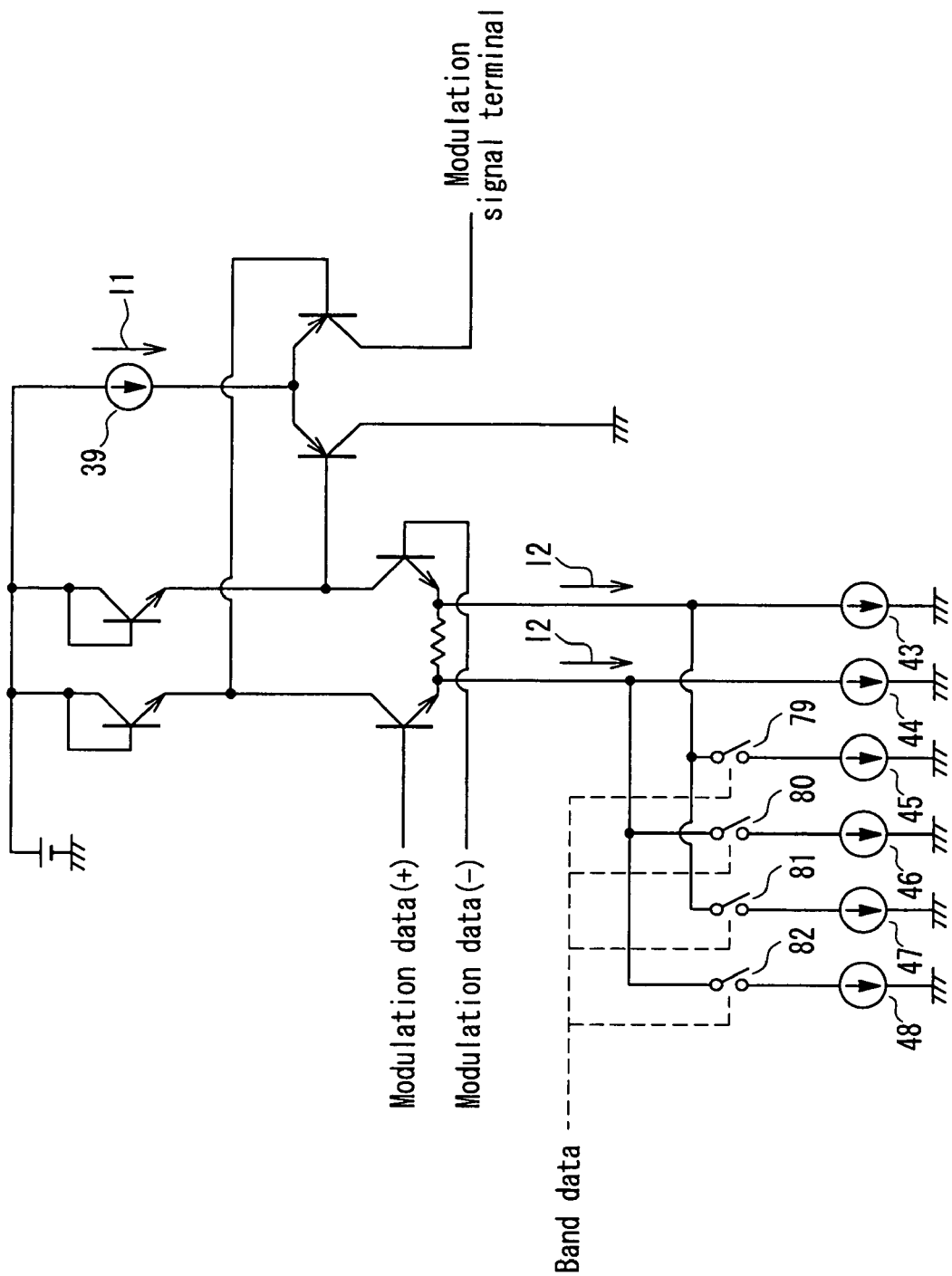
FIG. 23 is a circuit diagram showing an exemplary configuration of a current control circuit in the case where compensation is performed based on band data.

FIG. 23 is a circuit diagram showing an exemplary configuration of the current control circuit 6 in the case where compensation is performed based on the band data.

A gm value is changed by changing the current value 12 in accordance with the band data, and a deviation of the modulation factor occurring when a band is changed can be compensated. This circuit is operated such that switches 79 to 82 are opened or closed in accordance with the frequency band, thereby changing the gm value.

Figure 5:
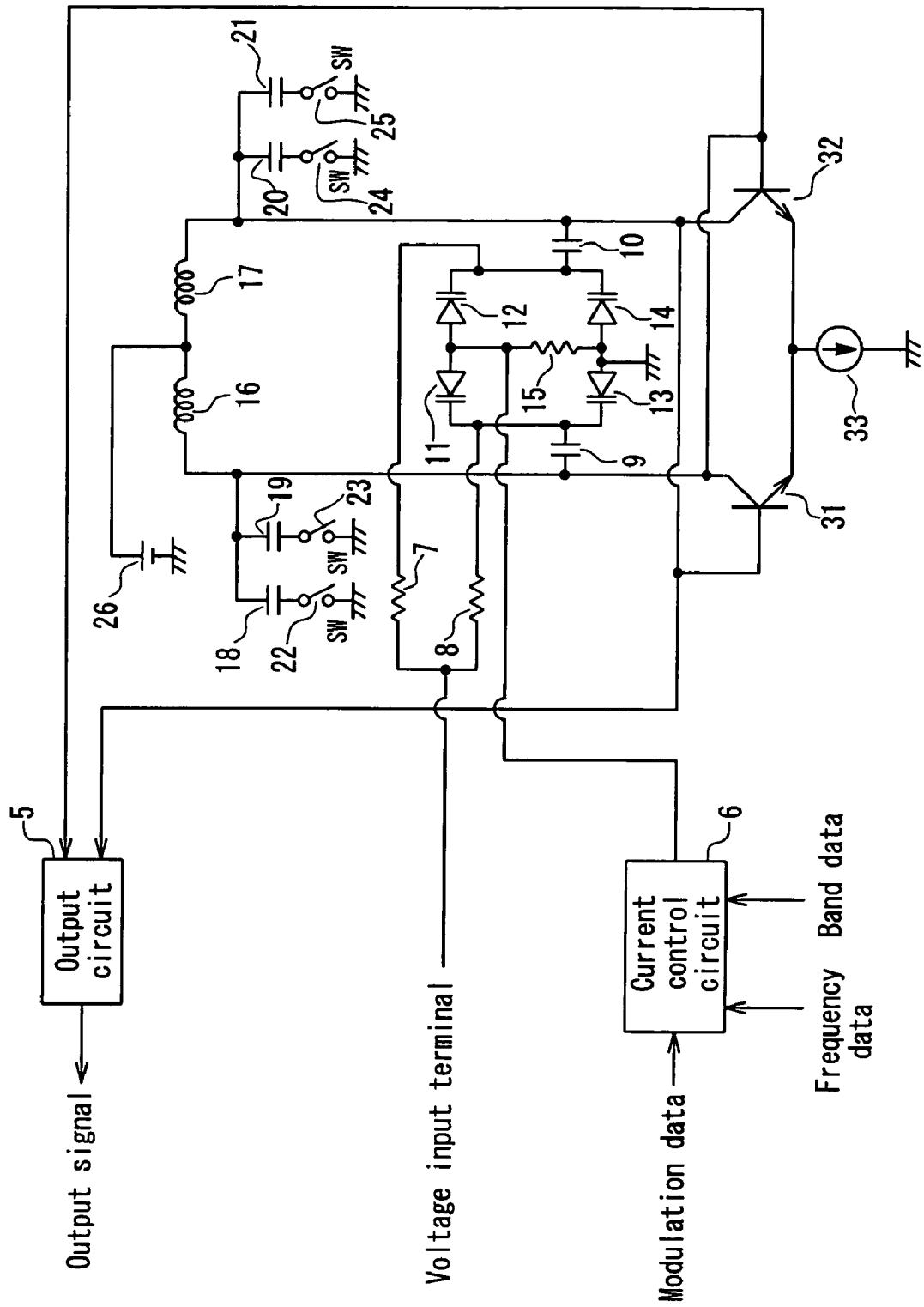
FIG. 5 is a circuit diagram showing an exemplary configuration of a voltage controlled oscillator with a modulation function according to a fifth embodiment of the present invention.

FIG. 5 is a circuit diagram showing an exemplary configuration of a VCO with a modulation function according to a fifth embodiment of the present invention. The VCO of this embodiment is different from the VCO shown in FIG. 2 in that the current control circuit 6 for compensating a modulation factor is added. In FIG. 5, the current control circuit 6 controls a modulation current so that a predetermined modulation factor is obtained from the frequency data, the frequency band data, and the modulation data.

Figure 24:
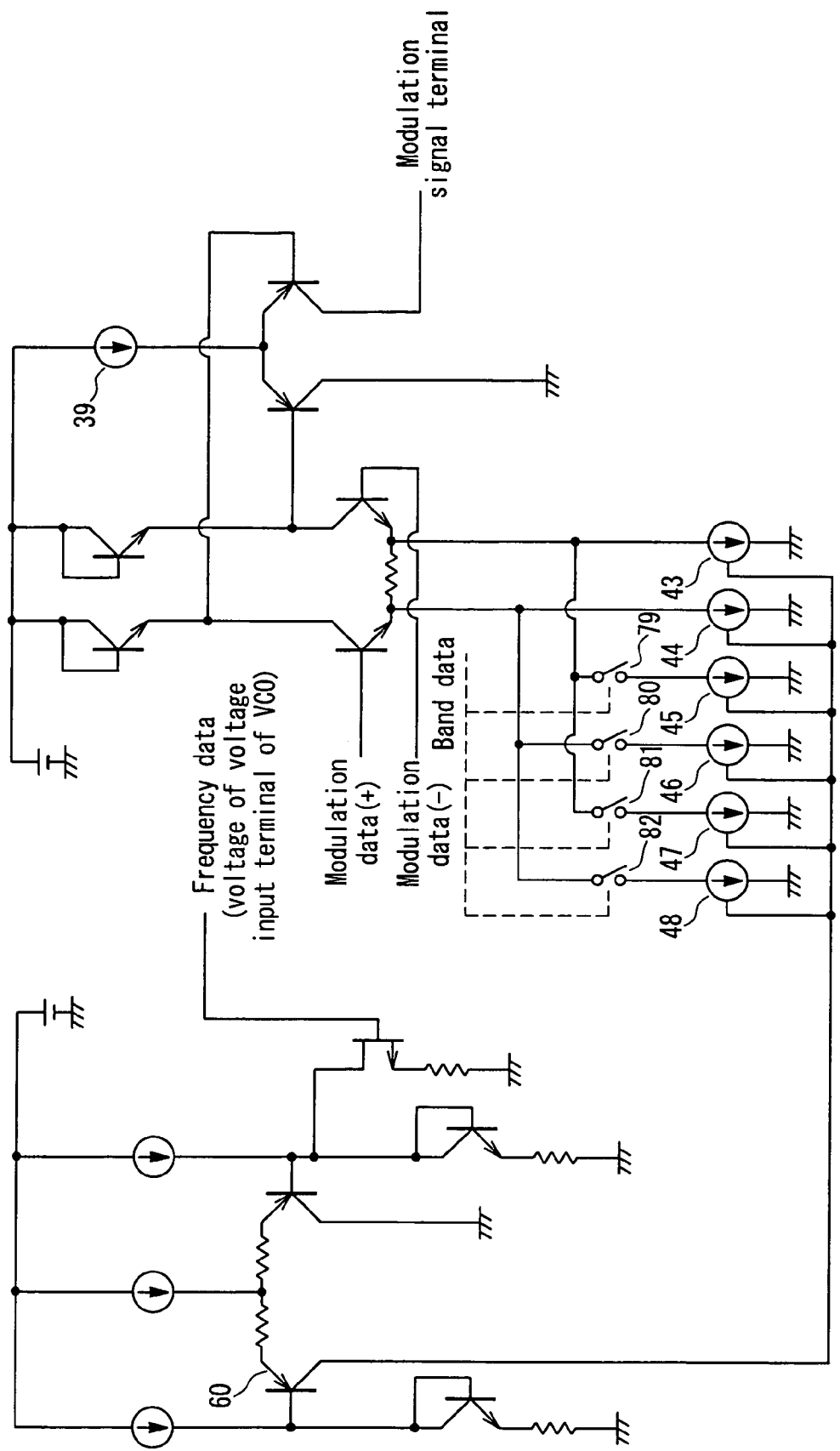
FIG. 24 is a circuit diagram showing an exemplary configuration of a current control circuit in the case where compensation is performed based on frequency data and band data.
Figure 25:
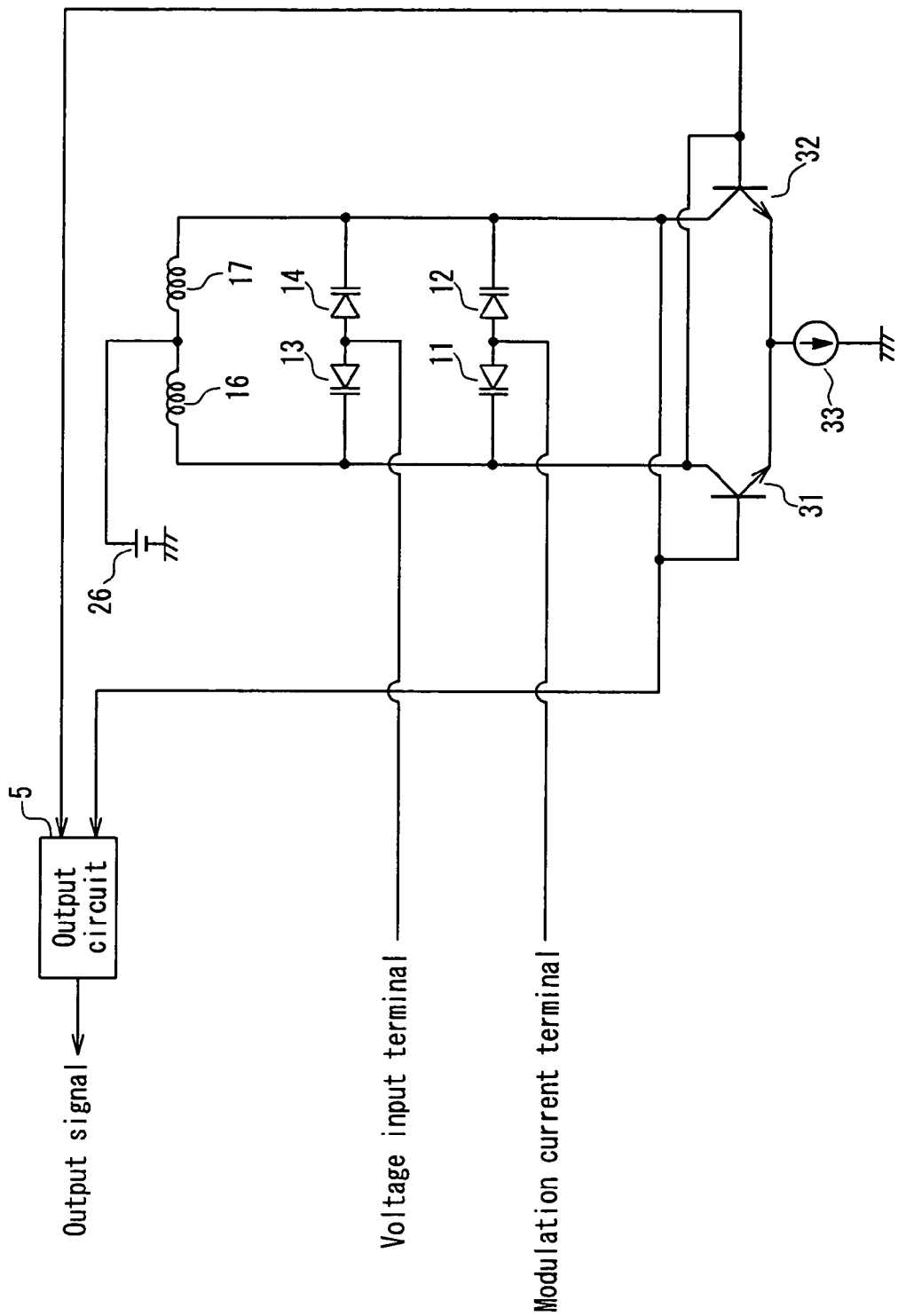
FIG. 25 is a circuit diagram showing an exemplary configuration of a conventional VCO having a modulation function.

FIG. 24 is a circuit diagram showing an exemplary configuration of the current control circuit 6 in the case where compensation is performed based on the frequency data and the band data. An operation of this circuit is a combination of the operations of the circuits shown in FIGS. 3 and 4.

Figure 6:
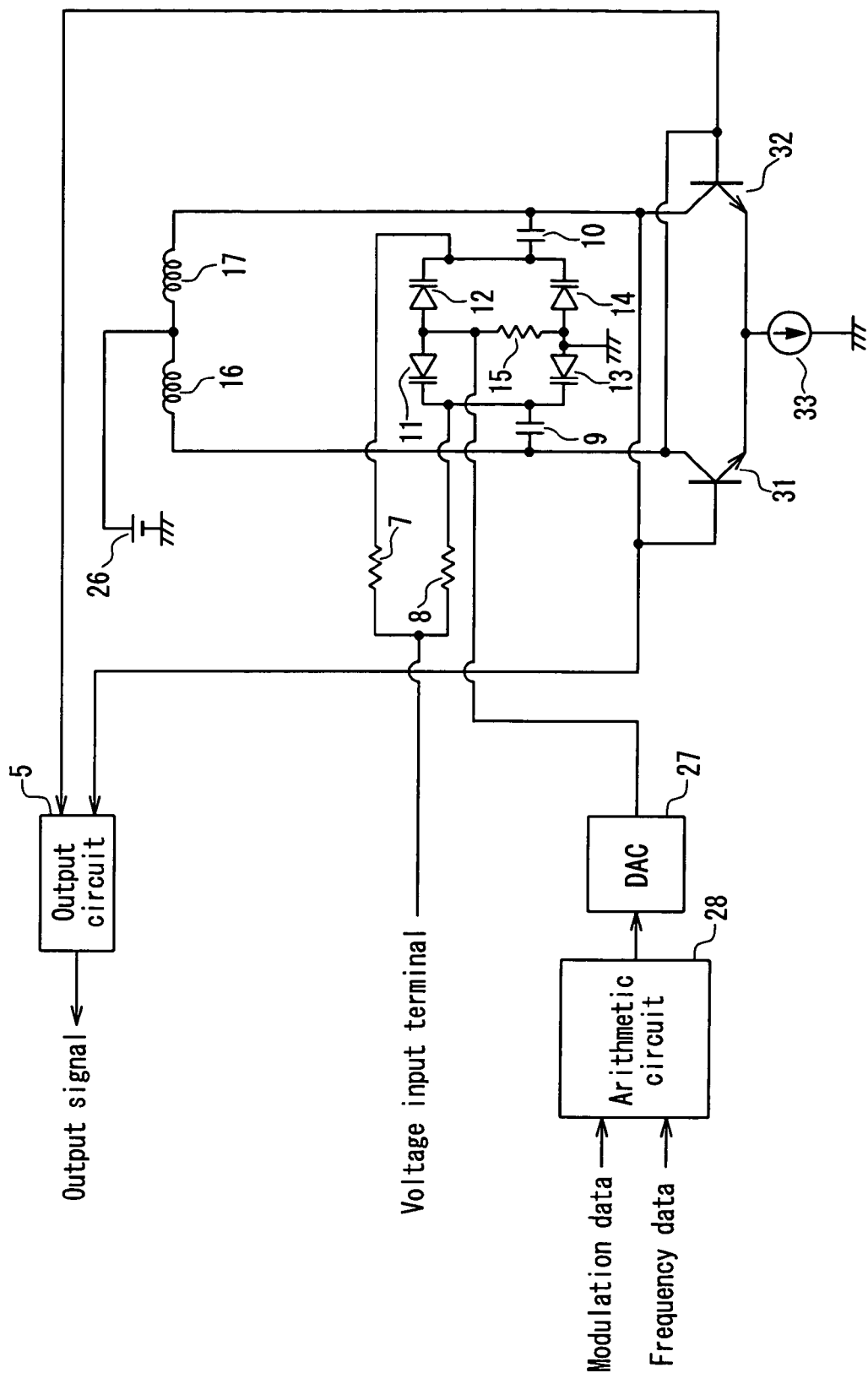
FIG. 6 is a circuit diagram showing an exemplary configuration of a voltage controlled oscillator with a modulation function according to a sixth embodiment of the present invention.

FIG. 6 is a circuit diagram showing an exemplary configuration of a VCO with a modulation function according to a sixth embodiment of the present invention. The VCO of this embodiment is different from the VCO shown in FIG. 1 in that a digital-analog converter 27 from which a current for compensating a modulation factor can be output and an arithmetic circuit 28 for controlling the digital-analog converter 27 are added. The frequency data and the modulation data are input to the arithmetic circuit 28, and a compensated modulation current is controlled by the digital-analog converter 27 so that a predetermined modulation factor is output from the VCO.

Figure 7:
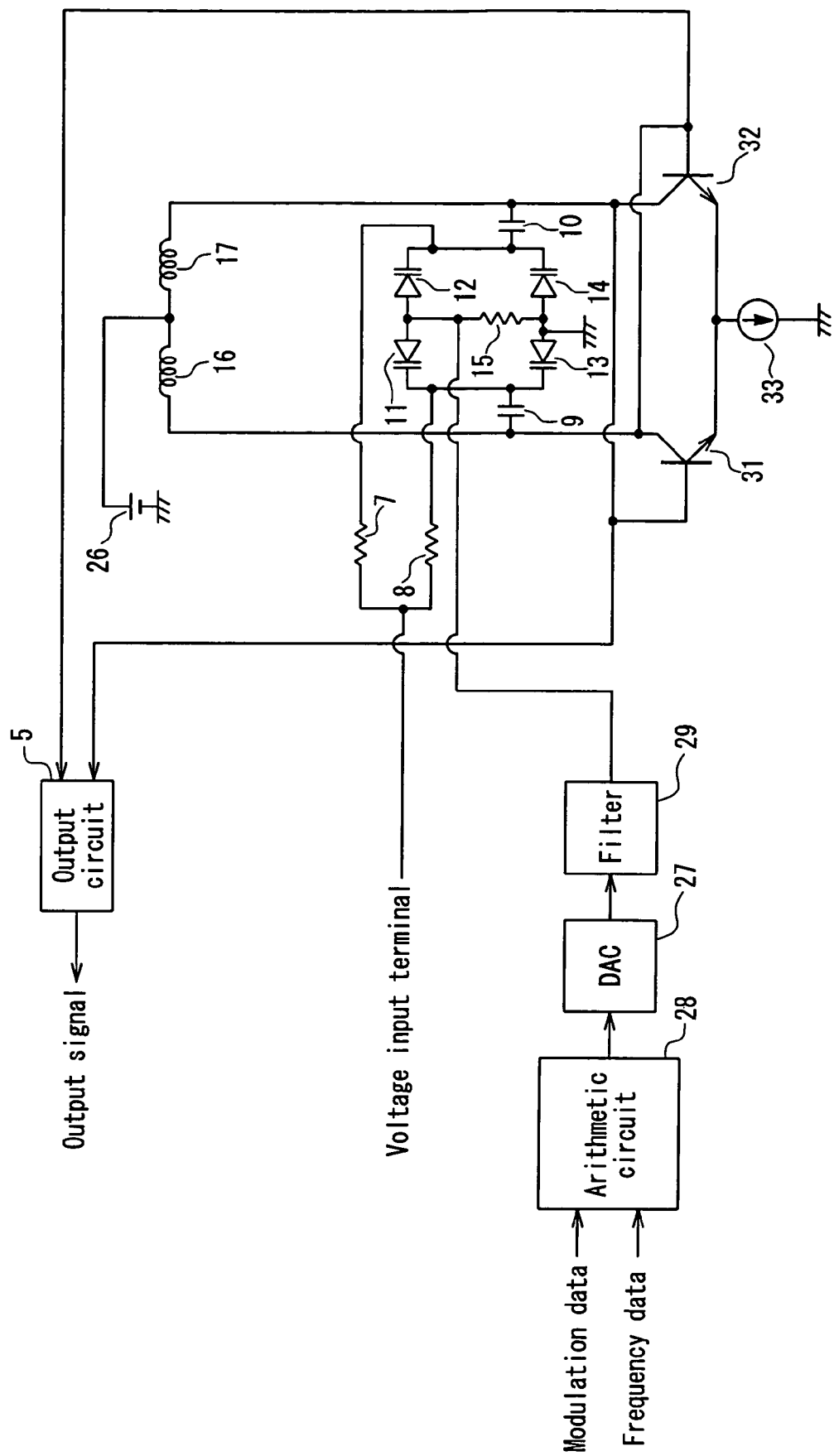
FIG. 7 is a circuit diagram showing an exemplary configuration of a voltage controlled oscillator with a modulation function according to a seventh embodiment of the present invention.

FIG. 7 is a circuit diagram showing an exemplary configuration of a VCO with a modulation function according to a seventh embodiment of the present invention. The VCO of this embodiment is different from the VCO shown in FIG. 6 in that a filter 29 from which a current for compensating a modulation factor can be output is provided between the digital-analog converter 27 and the modulation current terminal. In FIG. 7, the filter 29 has a function of eliminating a clock noise of the digital-analog converter 27.

Figure 8:
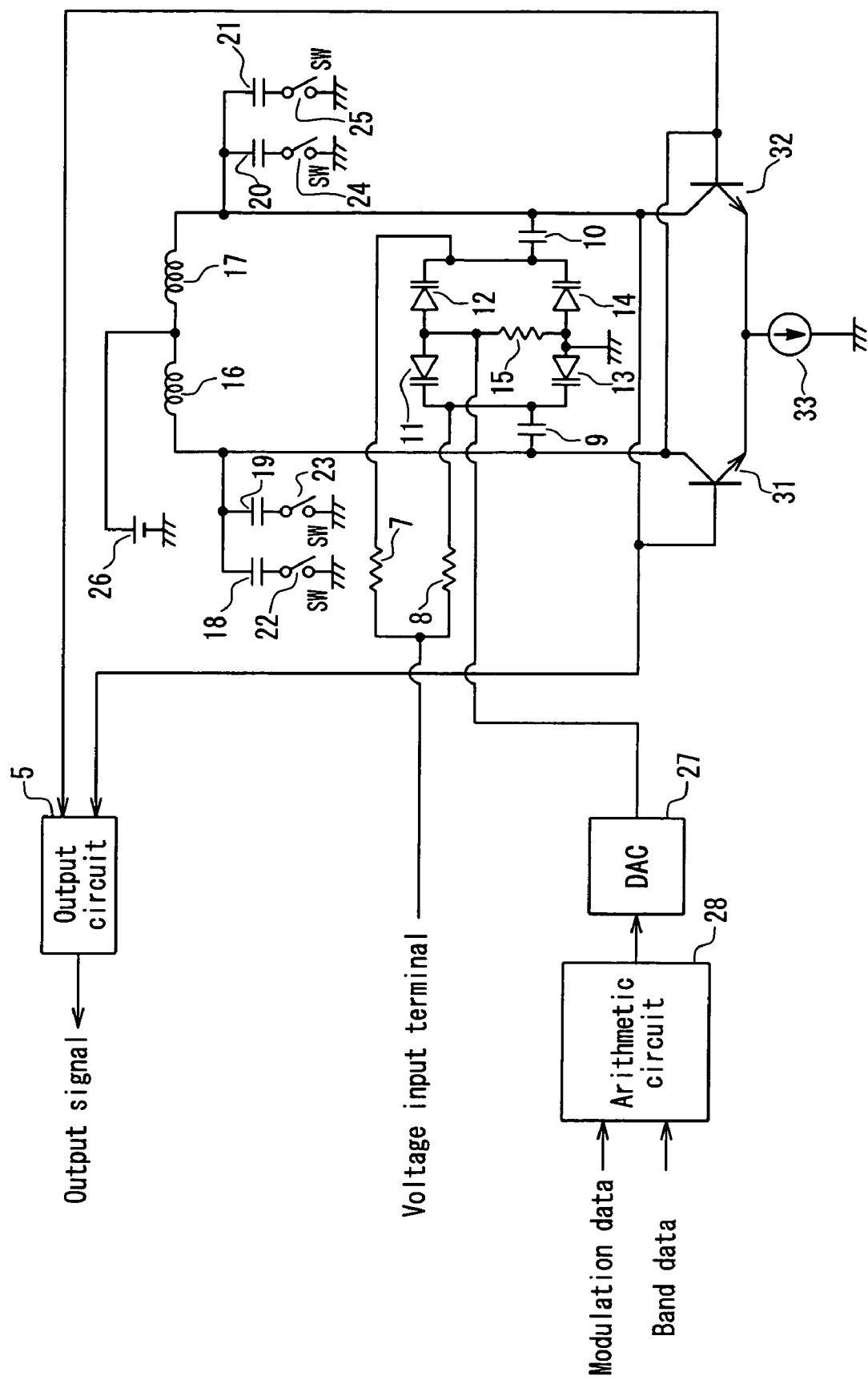
FIG. 8 is a circuit diagram showing an exemplary configuration of a voltage controlled oscillator with a modulation function according to an eighth embodiment of the present invention.

FIG. 8 is a circuit diagram showing an exemplary configuration of a VCO with a modulation function according to an eighth embodiment of the present invention. The VCO of this embodiment is different from the VCO shown in FIG. 2 in that the digital-analog converter 27 from which a current for compensating a modulation factor can be output and the arithmetic circuit 28 for controlling the digital-analog converter 27 are added. The frequency band data and the modulation data are input to the arithmetic circuit 28, and a compensated modulation current is controlled by the digital-analog converter 27 so that a predetermined modulation factor is output from the VCO.

Figure 9:
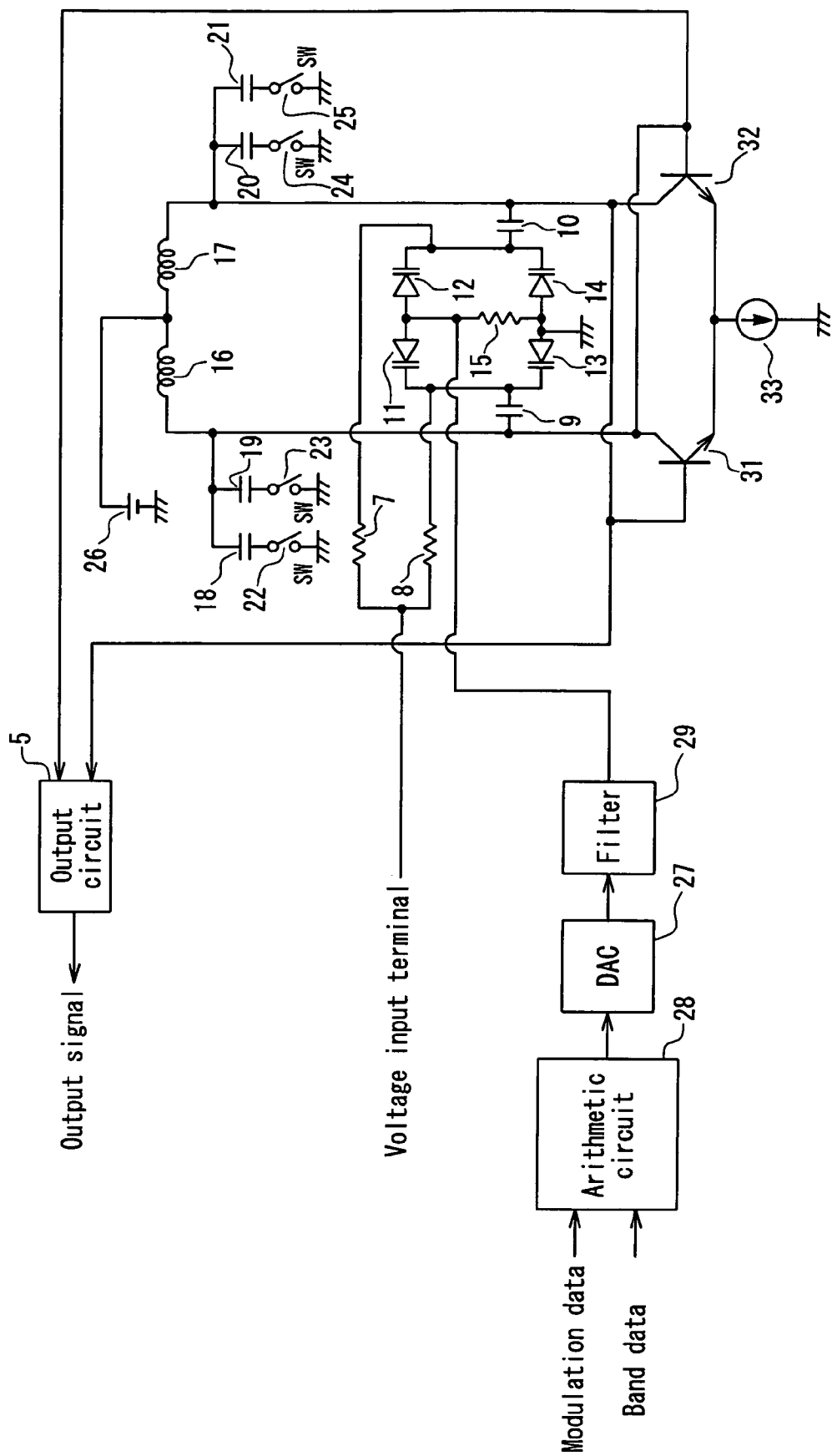
FIG. 9 is a circuit diagram showing an exemplary configuration of a voltage controlled oscillator with a modulation function according to a ninth embodiment of the present invention.

FIG. 9 is a circuit diagram showing an exemplary configuration of a VCO with a modulation function according to a ninth embodiment of the present invention. The VCO of this embodiment is different from the VCO shown in FIG. 8 in that the filter 29 from which a current for compensating a modulation factor can be output is provided between the digital-analog converter 27 and the modulation current terminal. In FIG. 9, the filter 29 has a function of eliminating a clock noise of the digital-analog converter 27.

Figure 10:
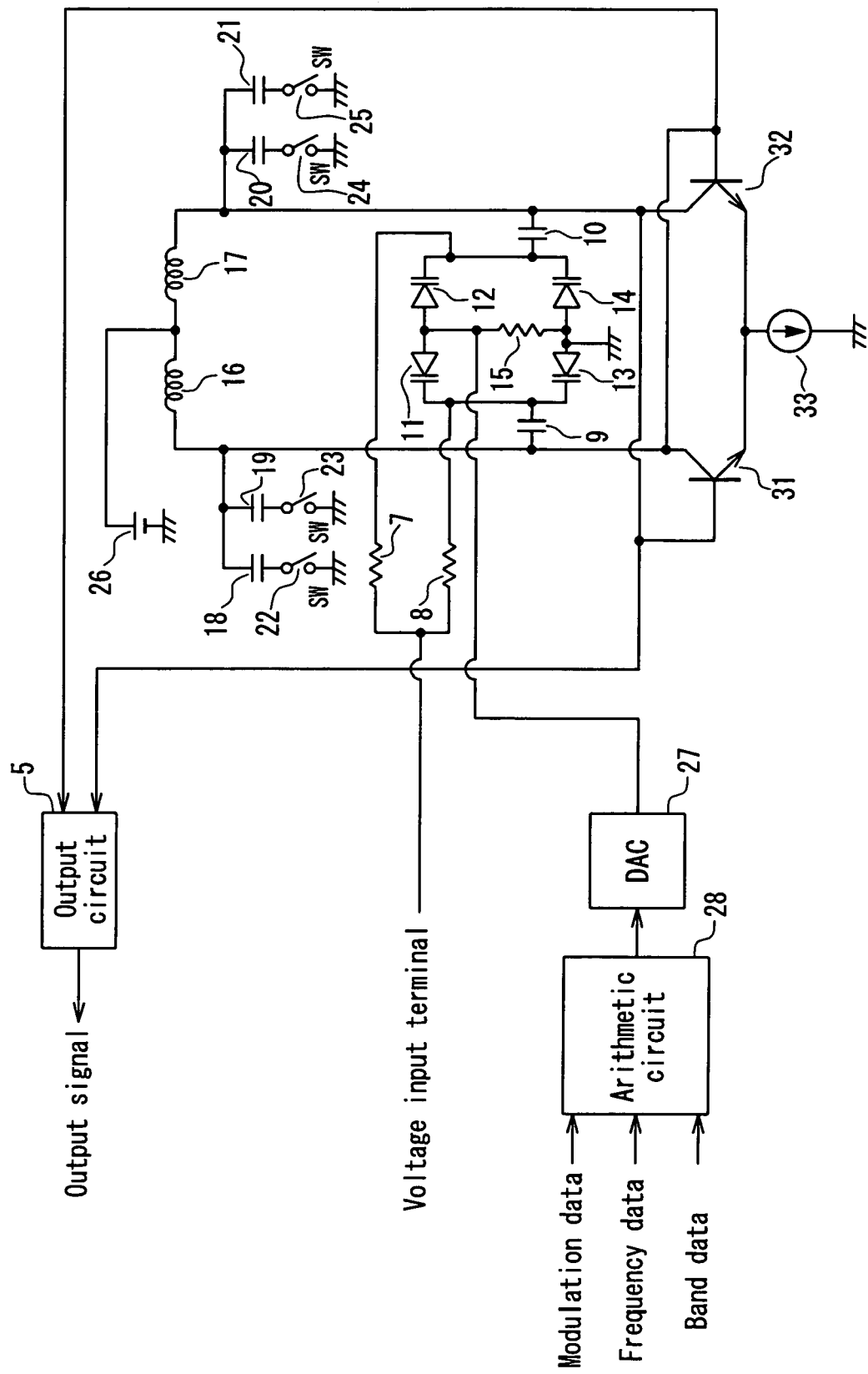
FIG. 10 is a circuit diagram showing an exemplary configuration of a voltage controlled oscillator with a modulation function according to a tenth embodiment of the present invention.

FIG. 10 is a circuit diagram showing an exemplary configuration of a VCO with a modulation function according to a tenth embodiment of the present invention. The VCO of this embodiment is different from the VCO shown in FIG. 2 in that the digital-analog converter 27 from which a current for compensating a modulation factor can be output and the arithmetic circuit 28 for controlling the digital-analog converter 27 are added. The frequency data, the band data, and the modulation data are input to the arithmetic circuit 28, and a compensated modulation current is controlled by the digital-analog converter 27 so that a predetermined modulation factor is output from the VCO.

Figure 11:
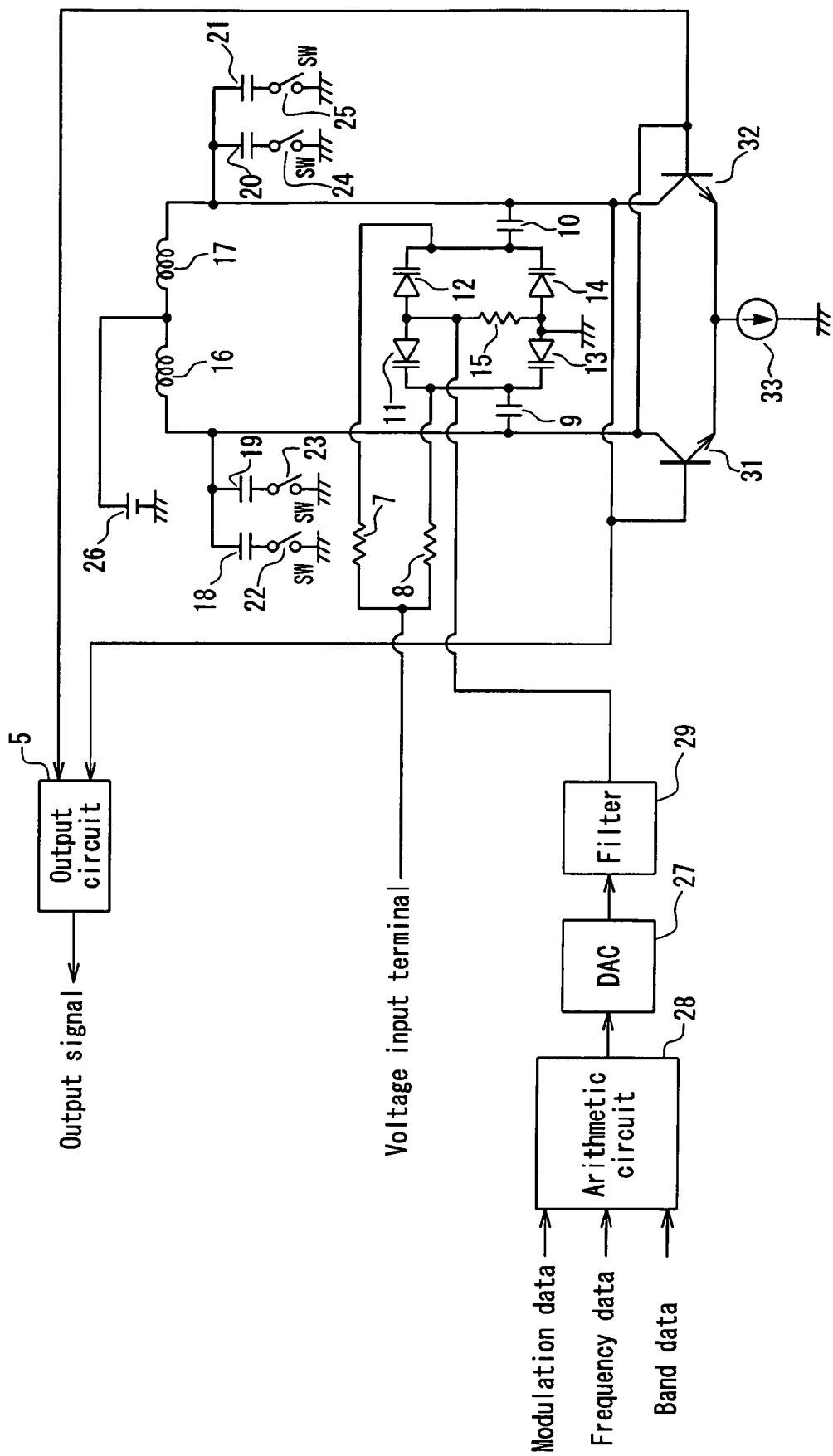
FIG. 11 is a circuit diagram showing an exemplary configuration of a voltage controlled oscillator with a modulation function according to an eleventh embodiment of the present invention.

FIG. 11 is a circuit diagram showing an exemplary configuration of a VCO with a modulation function according to an eleventh embodiment of the present invention. The VCO of this embodiment is different from the VCO shown in FIG. 10 in that the filter 29 from which a current for compensating a modulation factor can be output is provided between the digital-analog converter 27 and the modulation current terminal. In FIG. 11, the filter 29 has a function of eliminating a clock noise of the digital-analog converter 27.

Figure 12:
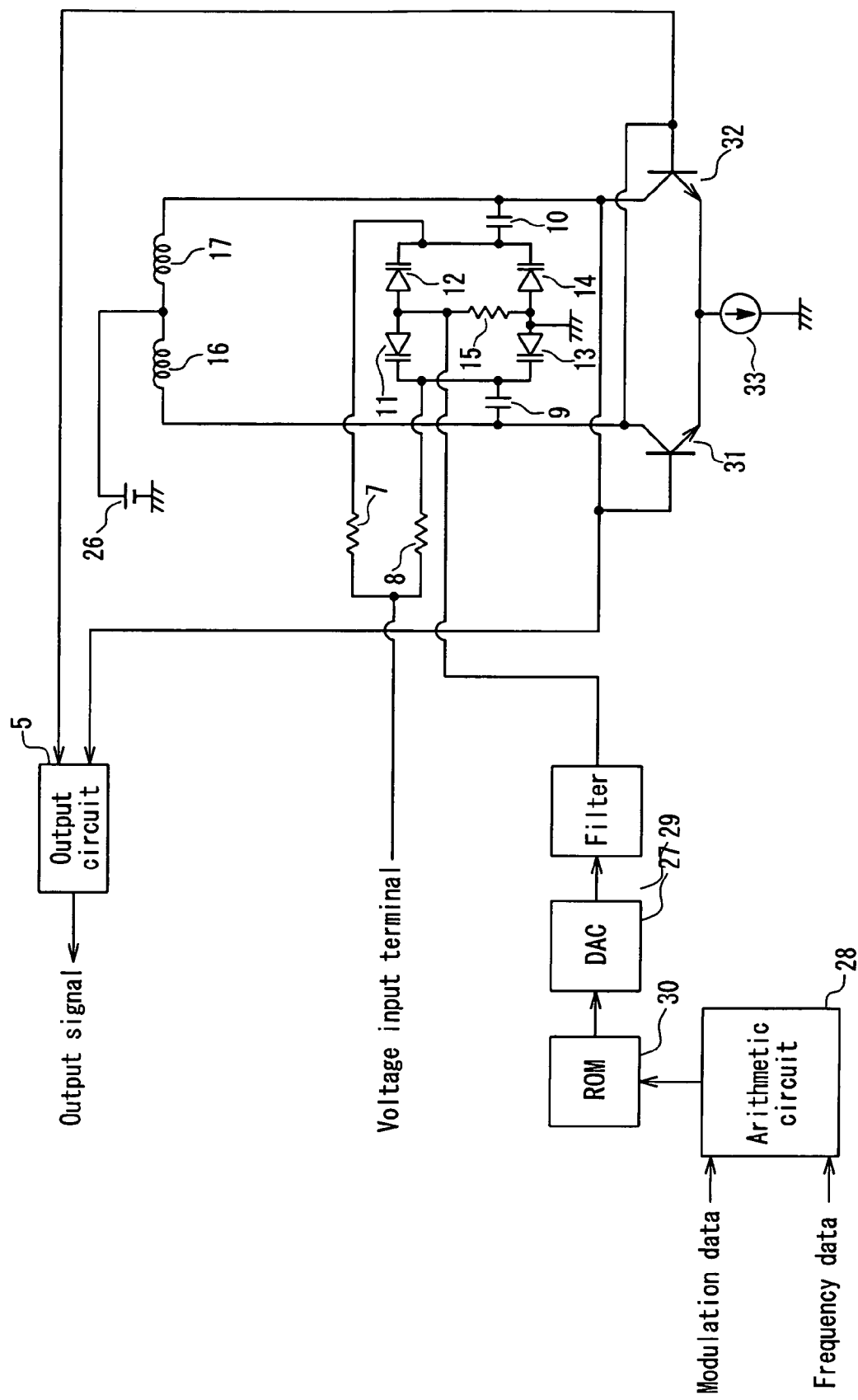
FIG. 12 is a circuit diagram showing an exemplary configuration of a voltage controlled oscillator with a modulation function according to a twelfth embodiment of the present invention.

FIG. 12 is a circuit diagram showing an exemplary configuration of a VCO with a modulation function according to a twelfth embodiment of the present invention. The VCO of this embodiment is different from the VCO shown in FIG. 7 in that a ROM 30 in which a data signal corresponding to an address signal from the arithmetic circuit 28 is stored is provided between the digital-analog converter 27 and the arithmetic circuit 28. The provision of the ROM 30 allows the circuit configuration of the arithmetic circuit 28 to be simplified and a more complicated modulation signal to be output by inputting band-limited modulation data or the like to the ROM 30 in advance.

Figure 13:
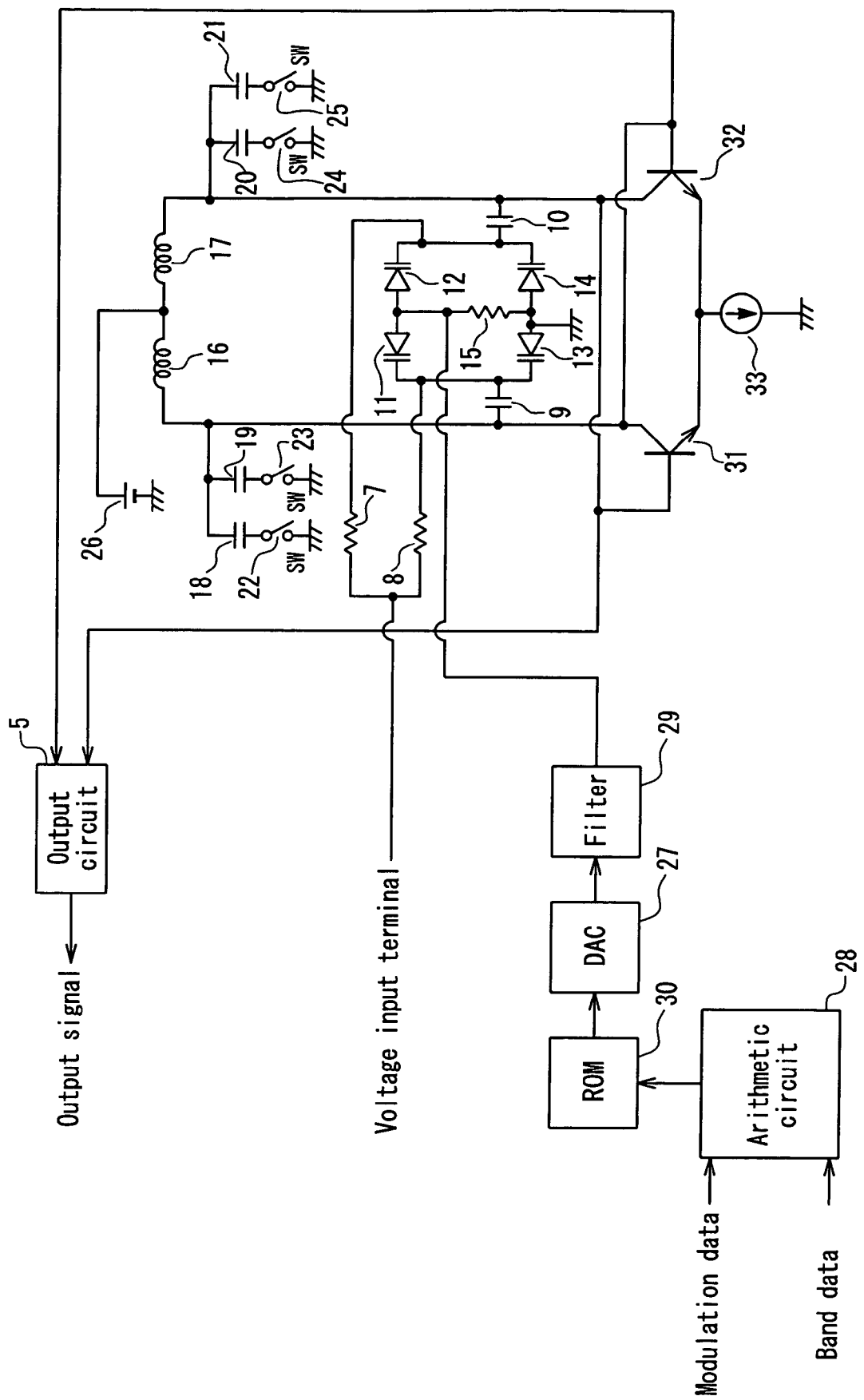
FIG. 13 is a circuit diagram showing an exemplary configuration of a voltage controlled oscillator with a modulation function according to a thirteenth embodiment of the present invention.

FIG. 13 is a circuit diagram showing an exemplary configuration of a VCO with a modulation function according to a thirteenth embodiment of the present invention. The VCO of this embodiment is different from the VCO shown in FIG. 9 in that the ROM 30 in which a data signal corresponding to an address signal from the arithmetic circuit 28 is stored is provided between the digital-analog converter 27 and the arithmetic circuit 28.

Figure 14:
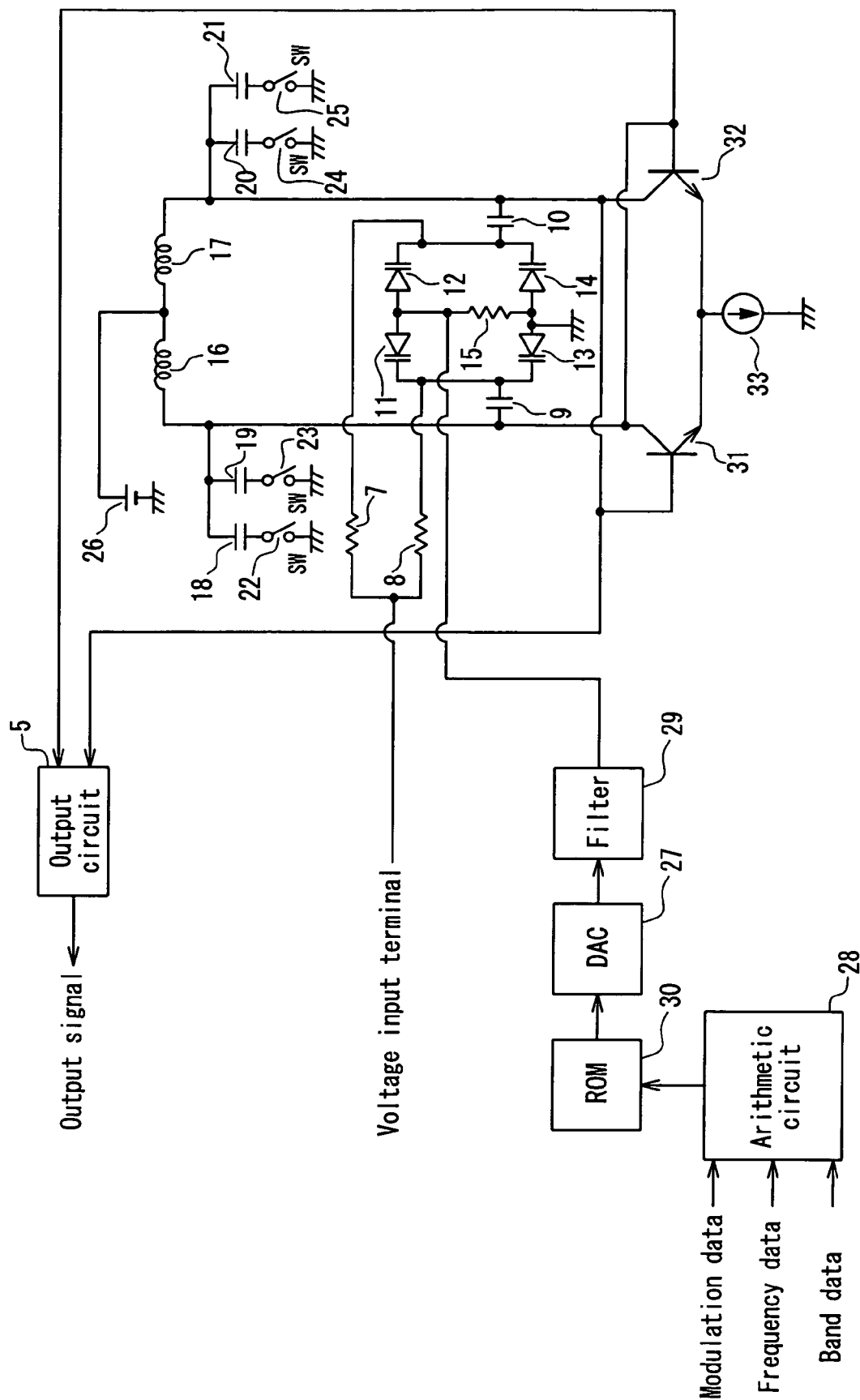
FIG. 14 is a circuit diagram showing an exemplary configuration of a voltage controlled oscillator with a modulation function according to a fourteenth embodiment of the present invention.

FIG. 14 is a circuit diagram showing an exemplary configuration of a VCO with a modulation function according to a fourteenth embodiment of the present invention. The VCO of this embodiment is different from the VCO shown in FIG. 11 in that the ROM 30 in which a data signal corresponding to an address signal from the arithmetic circuit 28 is stored is provided between the digital-analog converter 27 and the arithmetic circuit 28.

Figure 15:
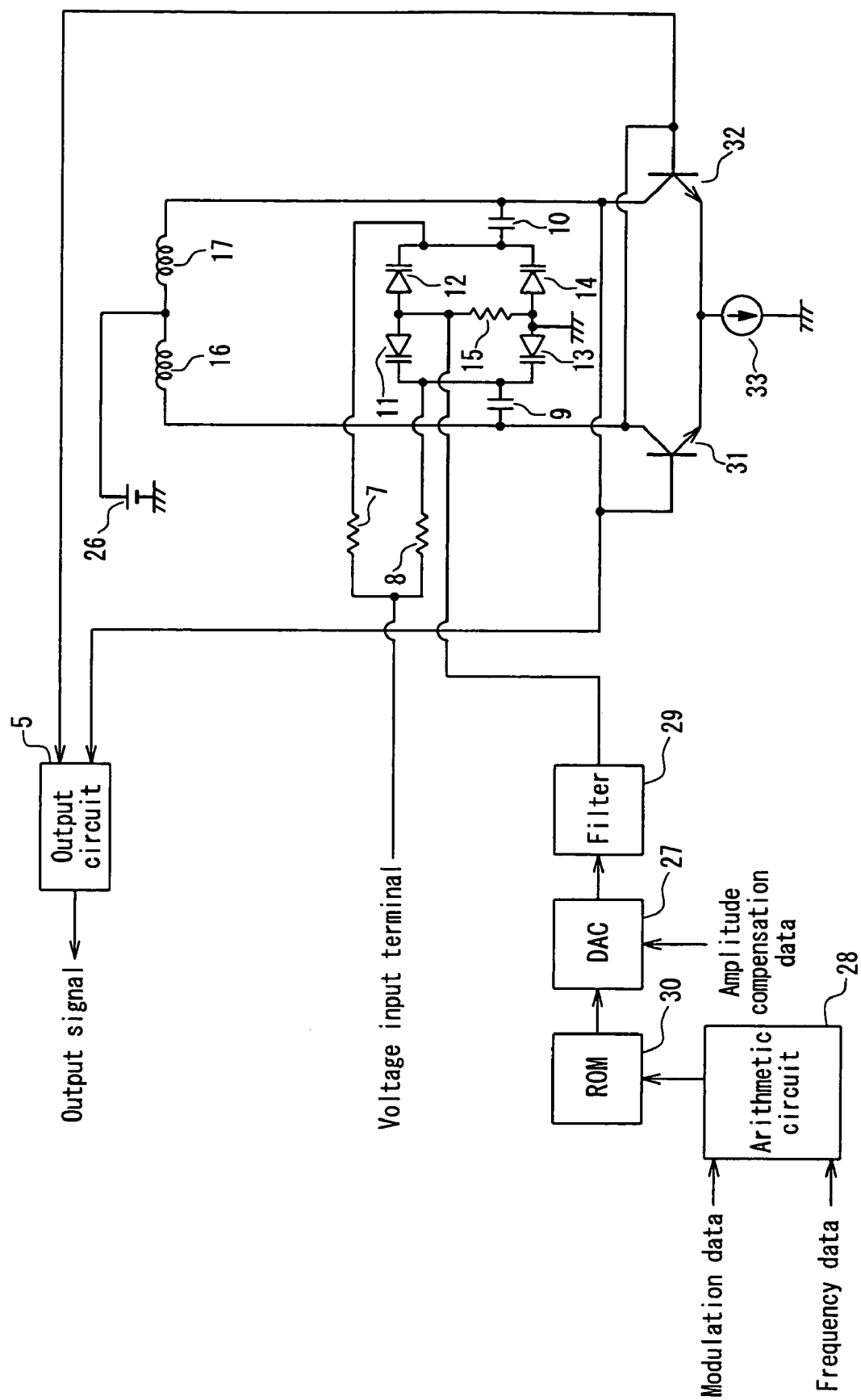
FIG. 15 is a circuit diagram showing an exemplary configuration of a voltage controlled oscillator with a modulation function according to a fifteenth embodiment of the present invention.

FIG. 15 is a circuit diagram showing an exemplary configuration of a VCO with a modulation function according to a fifteenth embodiment of the present invention. The VCO of this embodiment is different from the VCO shown in FIG. 12 in that the digital-analog converter 27 is provided with a function of compensating an output level thereof based on amplitude compensation data. This function is provided to compensate amplitude variations when a signal passes through the ROM 30, the digital-analog converter 27, and the filter 29, so as to obtain a modulation factor of the VCO that is adjusted to a center of the standard level.

Figure 16:
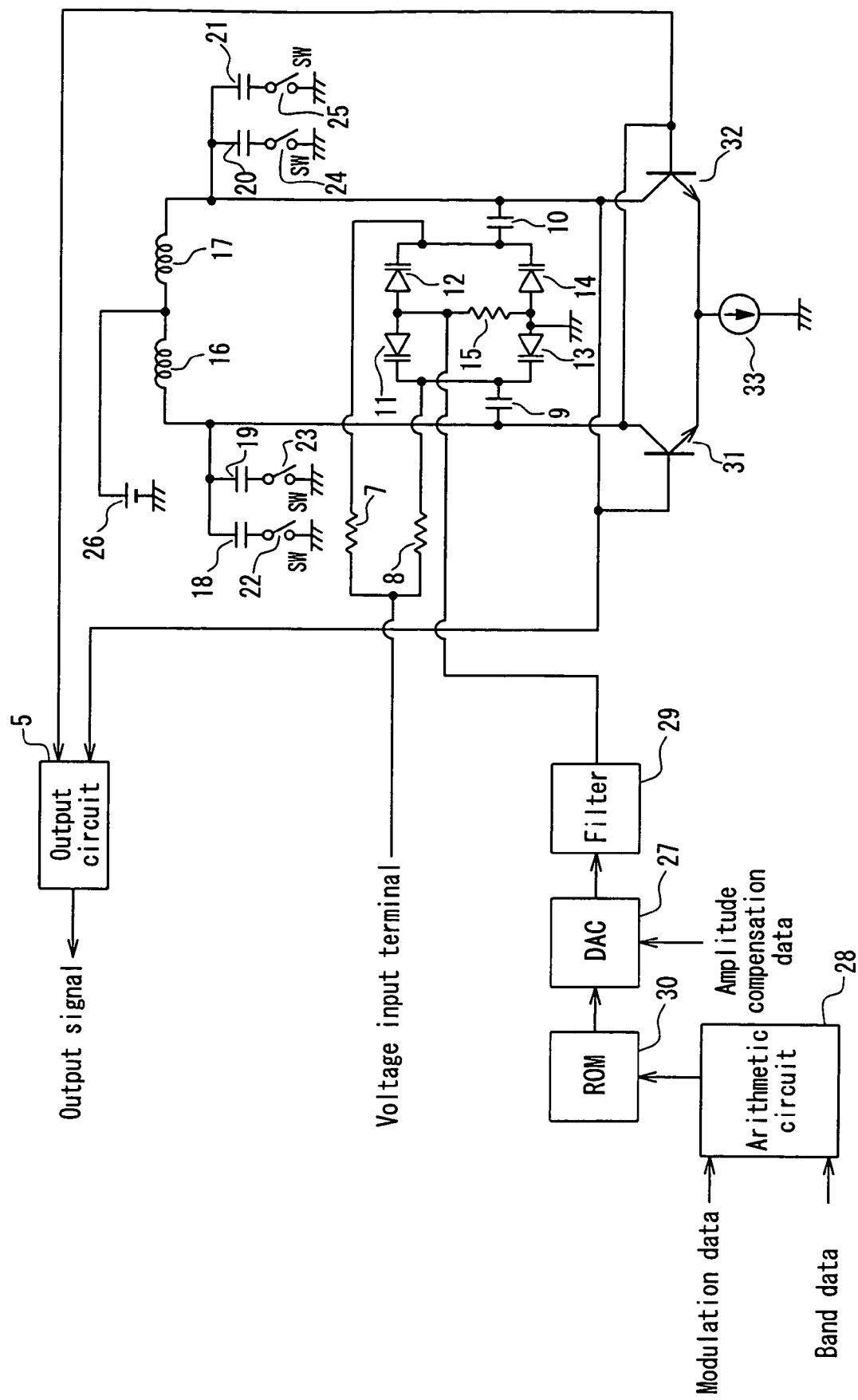
FIG. 16 is a circuit diagram showing an exemplary configuration of a voltage controlled oscillator with a modulation function according to a sixteenth embodiment of the present invention.

FIG. 16 is a circuit diagram showing an exemplary configuration of a VCO with a modulation function according to a sixteenth embodiment of the present invention. The VCO of this embodiment is different from the VCO shown in FIG. 13 in that the digital-analog converter 27 is provided with the function of compensating an output level thereof based on the amplitude compensation data.

Figure 17:
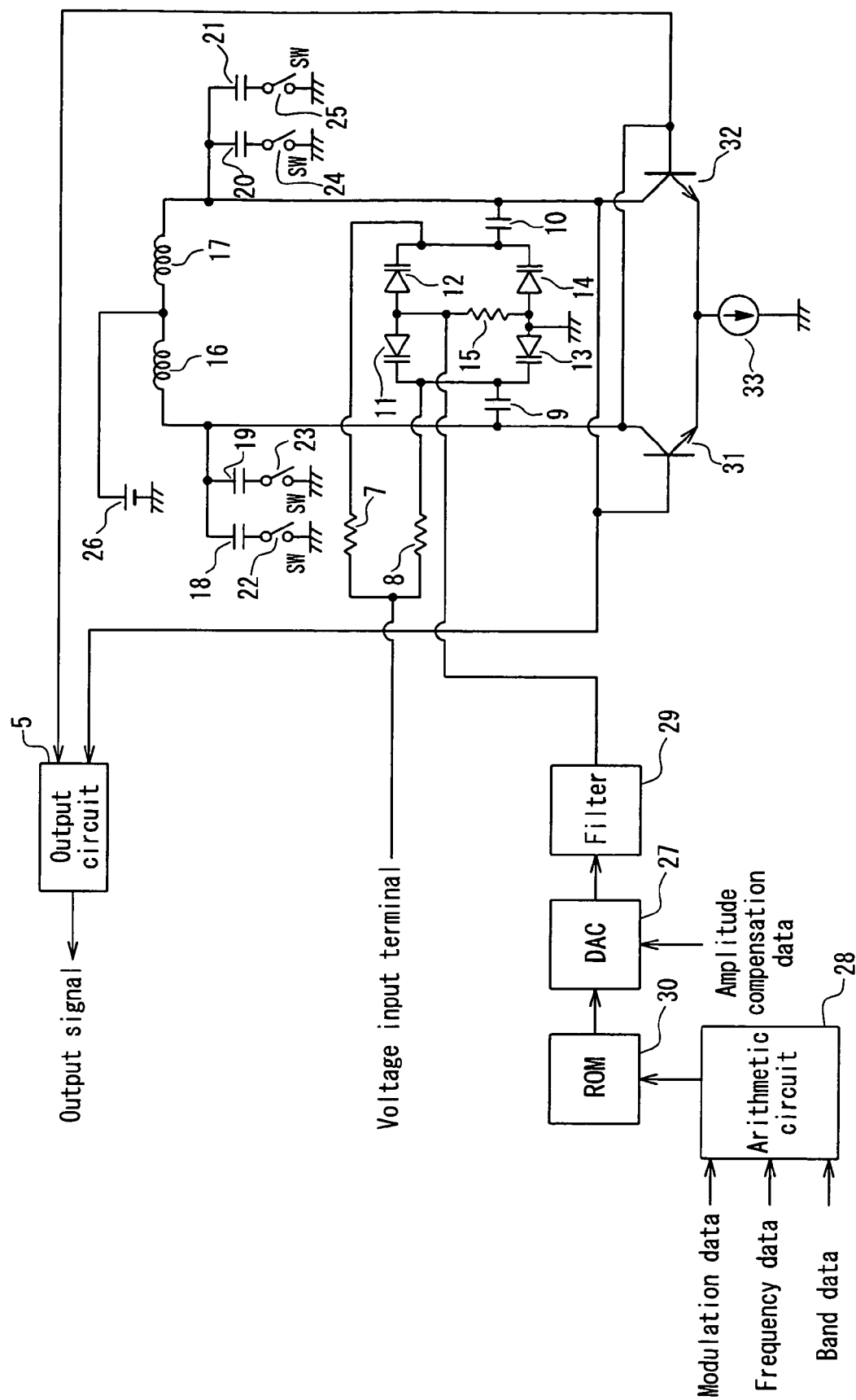
FIG. 17 is a circuit diagram showing an exemplary configuration of a voltage controlled oscillator with a modulation function according to a seventeenth embodiment of the present invention.

FIG. 17 is a circuit diagram showing an exemplary configuration of a VCO with a modulation function according to a seventeenth embodiment of the present invention. The VCO of this embodiment is different from the VCO shown in FIG. 14 in that the digital-analog converter 27 is provided with the function of compensating an output level thereof based on the amplitude compensation data.

Figure 18:
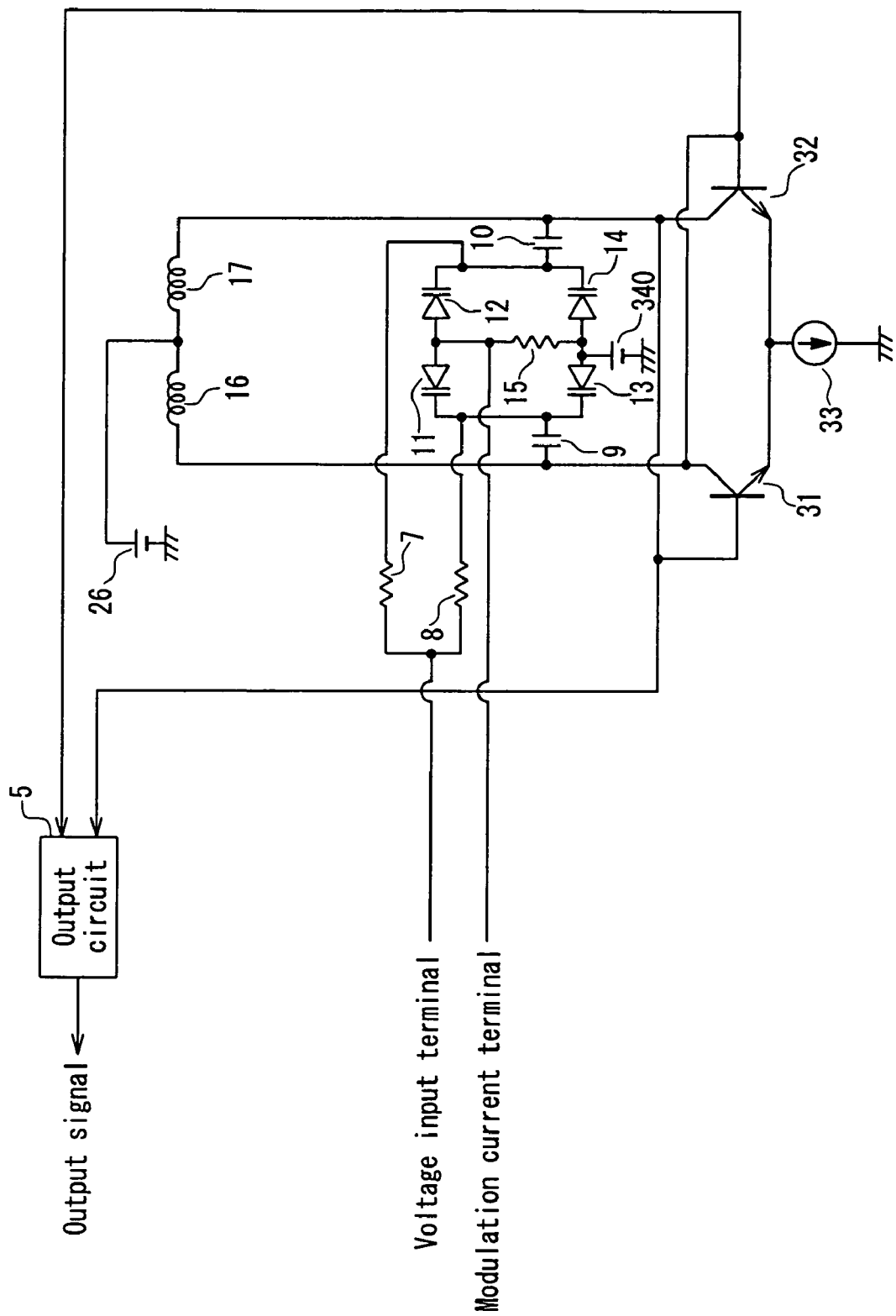
FIG. 18 is a circuit diagram showing an exemplary configuration of a voltage controlled oscillator with a modulation function according to an eighteenth embodiment of the present invention.

FIG. 18 is a circuit diagram showing an exemplary configuration of a VCO with a modulation function according to an eighteenth embodiment of the present invention. The VCO of this embodiment is different from the VCO shown in FIG. 1 in that the polarity of the varactor diodes is reversed. In FIG. 18, with the polarity reversal of the diodes, a cathode side of each of the polarity-reversed varactor diodes 13 and 14 is connected to a voltage source 340, while an anode side of each of the varactor diodes 13 and 14 is connected to a ground voltage (Gnd) in the VCO shown in FIG. 1. A voltage of the voltage source 340 is set to be higher than the voltage of the power input terminal. This configuration can be applied to any of the VCOs according to the first to seventeenth embodiments described with reference to FIGS. 1 to 17.

Figure 19:
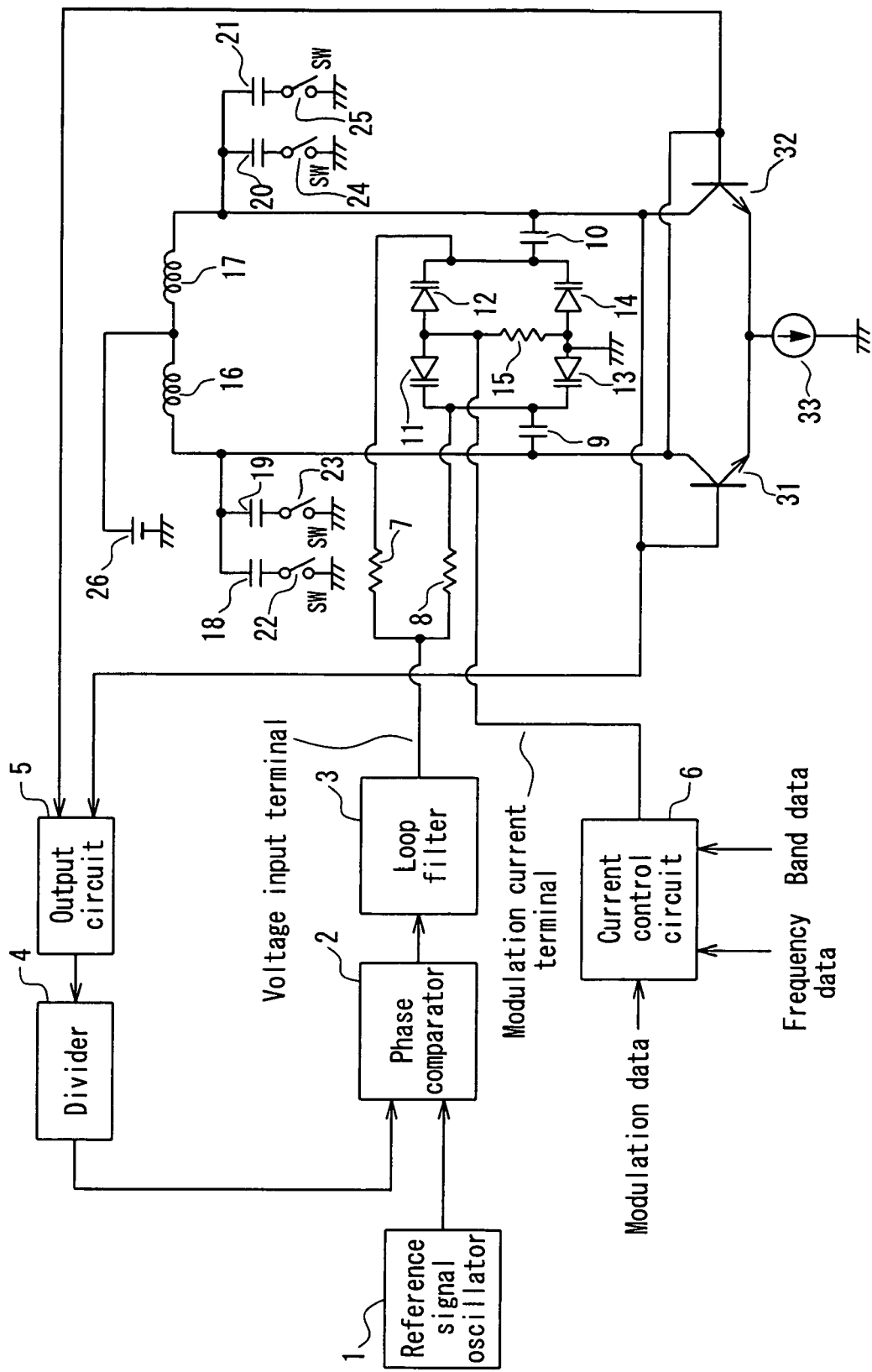
FIG. 19 is a circuit block diagram showing an example in which a PLL circuit is configured using the voltage controlled oscillator with a modulation function according to the fifth embodiment of the present invention.

FIG. 19 is a circuit block diagram showing an exemplary configuration in the case where the VCO shown in FIG. 5 is controlled by a PLL.

Figure 21:
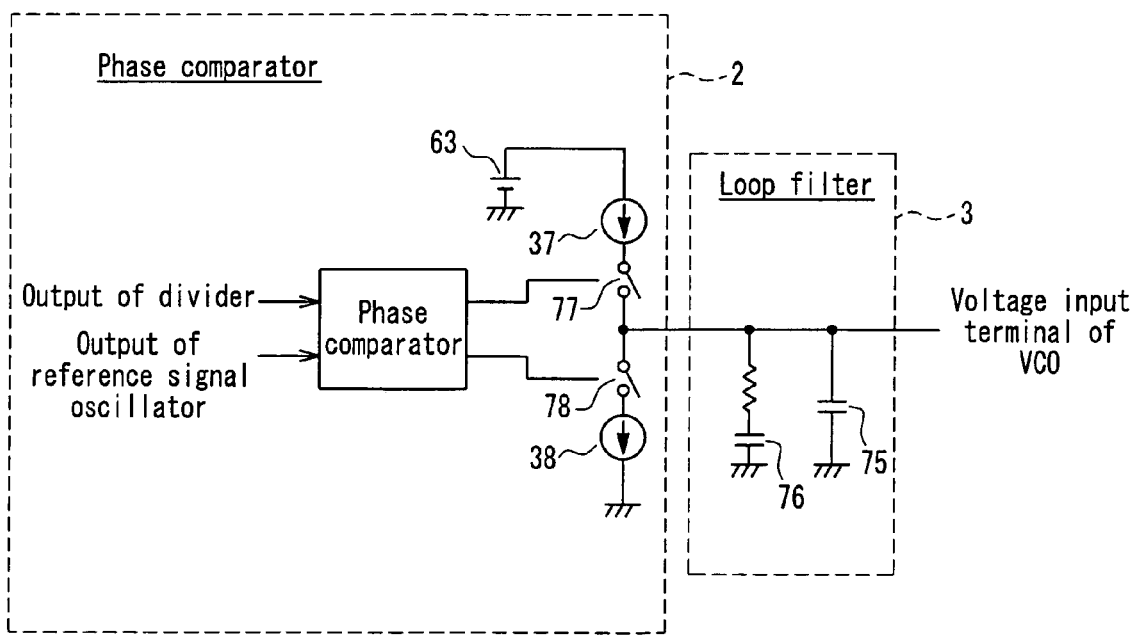
FIG. 21 is a circuit diagram showing an exemplary configuration of a phase comparator and a loop filter shown in FIG. 19.

In FIG. 19, reference numeral 1 denotes a reference signal oscillator, 2 denotes a phase comparator, 3 denotes a loop filter, and 4 denotes a divider. The phase comparator 2 compares the phase of a signal from the reference signal oscillator 1 with the phase of a signal obtained by dividing a signal from the output circuit 5 of the VCO with the divider 4, and the loop filter 3 smoothes the result of the phase comparison and outputs an output signal to the voltage input terminal of the VCO. FIG. 21 is a circuit diagram showing an exemplary configuration of the phase comparator 2 and the loop filter 3. The phase comparator 2 includes a phase comparator circuit, current sources 37 and 38, a voltage source 63, and switches 77 and 78, and has a charge pump function. With this configuration, an oscillation frequency of the VCO can be controlled to be constant, and in the case of changing the oscillation frequency of the VCO, it can be changed by changing a division ratio of the divider 4.

In the case of a frequency modulation operation, the switches 77 and 78 are opened, so that the output impedance of the phase comparator 2 is placed forcibly in a high impedance state. The voltage of the voltage input terminal of the VCO is fixed by capacitors 75 and 76 configuring the loop filter 3. In this state, a current is input to and output from the modulation current terminal, thereby performing a modulation operation.

The PLL circuit shown in FIG. 19 can be configured in the same manner also with respect to the VCOs shown in FIGS. 1 to 18.

As described above, the VCO with a modulation function of the present invention has a circuit configuration in which a frequency modulation factor is expressed as a function of Kv. Therefore, it is possible to configure easily a compensation circuit that allows a predetermined modulation factor to be obtained even when there are variations of respective circuit elements.

The invention claimed is:

1. A voltage controlled oscillator with a modulation function, comprising:
a first varactor diode;
a second varactor diode whose anode side is connected to an anode side of the first varactor diode and a ground voltage;
a third varactor diode whose cathode side is connected to a cathode side of the first varactor diode;
a fourth varactor diode whose anode side is connected to an anode side of the third varactor diode and whose cathode side is connected to a cathode side of the second varactor diode;
a first resistor connected between a connection point between the anode sides of the third varactor diode and the fourth varactor diode and a connection point between the anode sides of the first varactor diode and the second varactor diode;
a modulation current terminal for performing frequency modulation that is connected to the anode sides of the third varactor diode and the fourth varactor diode;
a second resistor connected between a connection point between the cathode sides of the first varactor diode and the third varactor diode and a voltage input terminal;
a third resistor connected between a connection point between the cathode sides of the second varactor diode and the fourth varactor diode and the voltage input terminal;
a first capacitor having a first end connected to a connection point between the cathode sides of the first varactor diode and the third varactor diode;
a first inductor having a first end connected to a second end of the first capacitor;
a second capacitor having a first end connected to a connection point between the cathode sides of the second varactor diode and the fourth varactor diode;
a second inductor having a first end connected to a second end of the second capacitor; and
a voltage source connected to second ends of the first inductor and the second inductor,
wherein a wave that is frequency-modulated is output by controlling a current.

2. The voltage controlled oscillator with a modulation function according to claim 1, wherein an oscillation frequency is shifted by changing a capacitance value of a capacitor including the first capacitor that configures a first LC resonant part in cooperation with the first inductor, and a capacitance value of a capacitor including the second capacitor that configures a second LC resonant part in cooperation with the second inductor, thereby obtaining a plurality of frequency bands.

3. The voltage controlled oscillator with a modulation function according to claim 1, comprising a current control circuit that is provided at the modulation current terminal, and controls a modulation current based on modulation data and frequency data.

4. The voltage controlled oscillator with a modulation function according to claim 2, comprising a current control circuit that is provided at the modulation current terminal, and controls a modulation current based on modulation data and band data.

5. The voltage controlled oscillator with a modulation function according to claim 2, comprising a current control circuit that is provided at the modulation current terminal, and controls a modulation current based on modulation data, frequency data, and band data.

6. The voltage controlled oscillator with a modulation function according to claim 1, comprising:

an arithmetic circuit for receiving modulation data and frequency data, and compensating a modulation current by an arithmetic operation; and a digital-analog converter for receiving a digital modulation current compensated by the arithmetic circuit, and converting the digital modulation current into an analog modulation current to the modulation current terminal.

7. The voltage controlled oscillator with a modulation function according to claim 6, comprising a filter that is provided between the modulation current terminal and the digital-analog converter, and eliminates a digital noise of the digital-analog converter.

8. The voltage controlled oscillator with a modulation function according to claim 2, comprising:

an arithmetic circuit for receiving modulation data and band data, and compensating a modulation current by an arithmetic operation; and a digital-analog converter for receiving a digital modulation current compensated by the arithmetic circuit, and converting the digital modulation current into an analog modulation current to the modulation current terminal.

9. The voltage controlled oscillator with a modulation function according to claim 8, comprising a filter that is provided between the modulation current terminal and the digital-analog converter, and eliminates a digital noise of the digital-analog converter.

10. The voltage controlled oscillator with a modulation function according to claim 2, comprising:

an arithmetic circuit for receiving modulation data, frequency data, and band data, and compensating a modulation current by an arithmetic operation; and a digital-analog converter for receiving a digital modulation current compensated by the arithmetic circuit, and converting the digital modulation current into an analog modulation current to the modulation current terminal.

11. The voltage controlled oscillator with a modulation function according to claim 10, comprising a filter that is provided between the modulation current terminal and the digital-analog converter, and eliminates a digital noise of the digital-analog converter.

12. The voltage controlled oscillator with a modulation function according to claim 1, comprising:

an arithmetic circuit for receiving modulation data and frequency data, and compensating a modulation current by an arithmetic operation;

a ROM for receiving as an address signal a digital modulation current compensated by the arithmetic circuit, and outputting a data signal stored in the ROM;

a digital-analog converter for receiving the data signal from the ROM, and converting the data signal into an analog modulation current to the modulation current terminal; and a filter that is provided between the modulation current terminal and the digital-analog converter, and eliminates a digital noise of the digital-analog converter.

13. The voltage controlled oscillator with a modulation function according to claim 2, comprising:

an arithmetic circuit for receiving modulation data and band data, and compensating a modulation current by an arithmetic operation;

a ROM for receiving as an address signal a digital modulation current compensated by the arithmetic circuit, and outputting a data signal stored in the ROM;

a digital-analog converter for receiving the data signal from the ROM, and converting the data signal into an analog modulation current to the modulation current terminal; and a filter that is provided between the modulation current terminal and the digital-analog converter, and eliminates a digital noise of the digital-analog converter.

14. The voltage controlled oscillator with a modulation function according to claim 2, comprising:

an arithmetic circuit for receiving modulation data, frequency data, and band data, and compensating a modulation current by an arithmetic operation;

a ROM for receiving as an address signal a digital modulation current compensated by the arithmetic circuit, and outputting a data signal stored in the ROM;

a digital-analog converter for receiving the data signal from the ROM, and converting the data signal into an analog modulation current to the modulation current terminal; and a filter that is provided between the modulation current terminal and the digital-analog converter, and eliminates a digital noise of the digital-analog converter.

15. The voltage controlled oscillator with a modulation function according to claim 12, wherein the digital-analog converter compensates an output amplitude level based on amplitude compensation data so as to adjust a central value of a modulation factor.

16. The voltage controlled oscillator with a modulation function according to claim 13, wherein the digital-analog converter compensates an output amplitude level based on amplitude compensation data so as to adjust a central value of a modulation factor.

17. The voltage controlled oscillator with a modulation function according to claim 14, wherein the digital-analog converter compensates an output amplitude level based on amplitude compensation data so as to adjust a central value of a modulation factor.

18. A voltage controlled oscillator with a modulation function, comprising:

a first varactor diode;

a second varactor diode whose cathode side is connected to a anode side of the first varactor diode and a voltage;

a third varactor diode whose anode side is connected to an cathode side of the first varactor diode;

a fourth varactor diode whose anode side is connected to a cathode side of the third varactor diode and whose cathode side is connected to an anode side of the second varactor diode;

a first resistor connected between a connection point between the anode sides of the third varactor diode and the fourth varactor diode and a connection point between the anode sides of the first varactor diode and the second varactor diode;

a modulation current terminal for performing frequency modulation that is connected to the anode sides of the third varactor diode and the fourth varactor diode;

a second resistor connected between a connection point between the cathode sides of the first varactor diode and the third varactor diode and a voltage input terminal;

a third resistor connected between a connection point between the cathode sides of the second varactor diode and the fourth varactor diode and the voltage input terminal;

a first capacitor having a first end connected to a connection point between the cathode sides of the first varactor diode and the third varactor diode;

a first inductor having a first end connected to a second end of the first capacitor;

a second capacitor having a first end connected to a connection point between the cathode sides of the second varactor diode and the fourth varactor diode;

a second inductor having a first end connected to a second end of the second capacitor; and a voltage source connected to second ends of the first inductor and the second inductor, wherein a wave that is frequency-modulated is output by controlling a current.

19. The voltage controlled oscillator with a modulation function according to claim 3, wherein an input voltage from the voltage input terminal is used instead of the frequency data.

* * * * *

UNITED STATES PATENT AND TRADEMARK OFFICE
CERTIFICATE OF CORRECTION

PATENT NO.         : 7,053,726 B2
APPLICATION NO. : 10/522395
DATED              : May 30, 2006
INVENTOR(S)      : Hino It is certified that error appears in the above-identified patent and that said Letters Patent is hereby corrected as shown below:

Page 1, first column, assignee: "CO," should read --Co,--

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 7,053,726 B2  Page 1 of 1
APPLICATION NO. : 10/522395
DATED : May 30, 2006
INVENTOR(S) : Hino It is certified that error appears in the above-identified patent and that said Letters Patent is hereby corrected as shown below:

Title Page, Item (73), assignee: "CO," should read --Co.,--

This certificate supersedes the Certificate of Correction issued March 6, 2007.

Signed and Sealed this

Seventeenth Day of November, 2009

David J. Kappos
*Director of the United States Patent and Trademark Office*